US012795949B2

(12) United States Patent
Fantini et al.

(10) Patent No.: US 12,795,949 B2
(45) Date of Patent: Nov. 10, 2026

(54) VERTICAL 3D MEMORY DEVICE AND ACCESSING METHOD

(71) Applicant: Micron Technology, Inc., Boise, ID (US)

(72) Inventors: Paolo Fantini, Vimercate (IT); Corrado Villa, Sovico (IT); Stefan Frederik Schippers, Peschiera del Garda (IT); Efrem Bolandrina, Fiorano al Serio (IT)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 18/407,074

(22) Filed: Jan. 8, 2024

(65) Prior Publication Data

US 2024/0237358 A1 Jul. 11, 2024

Related U.S. Application Data

(62) Division of application No. 16/976,411, filed as application No. PCT/IB2020/020028 on May 25, 2020, now Pat. No. 11,877,457.

(51) Int. Cl.
*H10B 63/00* (2023.01)
*G11C 13/00* (2006.01)

(52) U.S. Cl.
CPC ......... *H10B 63/34* (2023.02); *G11C 13/0004* (2013.01); *G11C 13/003* (2013.01);
(Continued)

(58) Field of Classification Search
CPC .. H10B 63/34; H10B 63/845; G11C 13/0004; G11C 13/003; G11C 2213/71;
(Continued)

(56) References Cited

U.S. PATENT DOCUMENTS 9,450,023 B1 9/2016 Konevecki et al.
2008/0112209 A1 5/2008 Cho et al.
(Continued)

FOREIGN PATENT DOCUMENTS

CN 1841748 A 10/2006

OTHER PUBLICATIONS

Chinese patent office, "CN Notice of Allowance, including Search Report," issued in connection with China Patent Application No. 202080101330.3 dated Apr. 1, 2025 (8 pages total; 4 pages Original & 4 pages machine translation).
(Continued)

*Primary Examiner* — Jerome Leboeuf
(74) *Attorney, Agent, or Firm* — Holland & Hart LLP

(57) ABSTRACT

A memory device comprises a memory layer including a vertical three-dimensional (3D) memory array of memory cells formed therein, wherein a memory cell is accessed through a word line and a digit line orthogonal to each other, and the digit line is in a form of conductive pillar extending vertically; a pillar selection layer formed under the memory layer and having thin film transistors (TFTs) formed therein for accessing memory cells; and a peripheral circuit layer formed under the pillar selection layer and having a sense amplifier and a decoding circuitry for word lines and bit lines, wherein a TFT is configured for each pillar.

19 Claims, 28 Drawing Sheets

(52) U.S. Cl.
CPC ....... *H10B 63/845* (2023.02); *G11C 2213/71* (2013.01); *G11C 2213/79* (2013.01)

(58) Field of Classification Search
CPC .............. G11C 2213/79; G11C 13/004; G11C 13/0069; G11C 13/0011; H10D 30/6728; H10D 30/6745
See application file for complete search history.

(56) References Cited

U.S. PATENT DOCUMENTS

| | | | | |
|---|---|---|---|---|
| 2013/0223127 | A1 | 8/2013 | Park et al. | |
| 2015/0311256 | A1 | 10/2015 | Rabkin et al. | |
| 2016/0351722 | A1 | 12/2016 | Zhou et al. | |
| 2017/0154925 | A1 | 6/2017 | Shimabukuro et al. | |
| 2017/0365639 | A1 | 12/2017 | Murooka | |
| 2019/0115391 | A1 * | 4/2019 | Nardi | H10N 70/8828 |
| 2021/0074726 | A1 | 3/2021 | Lue | |
| 2021/0135010 | A1 * | 5/2021 | Yamazaki | H10B 43/27 |

OTHER PUBLICATIONS

International Search Report and Written Opinion received for PCT Patent Application No. PCT/IB2020/020028, mailed on Feb. 15, 2021, 10 pages.

* cited by examiner

VERTICAL 3D MEMORY DEVICE AND ACCESSING METHOD

CROSS REFERENCE

The present application for patent is a divisional of U.S. patent application Ser. No. 16/976,411 by FANTINI et al., entitled "IMPROVED VERTICAL 3D MEMORY DEVICE AND ACCESSING METHOD DESCRIPTION," filed Aug. 27, 2020, which is a 371 national phase filing of and claims priority to and the benefit of International Patent Application No. PCT/IB2020/020028 by FANTINI et al., entitled "IMPROVED VERTICAL 3D MEMORY DEVICE AND ACCESSING METHOD DESCRIPTION," filed May 25, 2020, each of which is assigned to the assignee hereof, and each of which is expressly incorporated by reference herein.

BACKGROUND

The following disclosure relates generally to a field of electronics, and more specifically to an improved vertical 3D (Three-Dimensional) memory device structure and to a relating accessing method.

Electronic memory devices (hereinafter, briefly referred to as "memory devices") are widely used to store data in various electronic devices such as tablets, computers, wireless communication devices (e.g., smartphones), cameras, digital displays, and the like.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

A goal of the present disclosure is to provide an improved memory device with an extra selection element and an efficient method for accessing a memory cell of the memory device.

DETAILED DESCRIPTION

Figure 1:
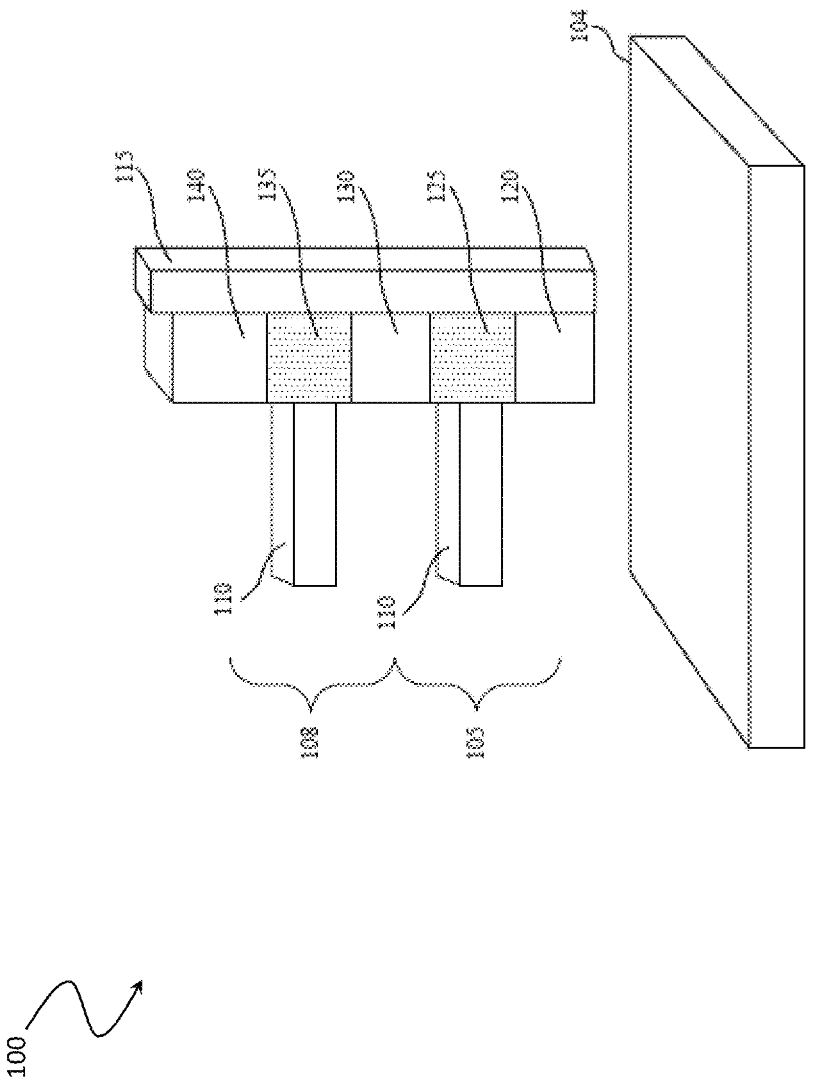
FIG. 1 illustrates an example of an example memory array that supports a vertical 3D memory device having an NMOS TFT selector in accordance with examples as disclosed herein.

The present disclosure relates to a vertical 3D memory device having an NMOS TFT selector, and methods of accessing the same. The memory device may comprise a memory layer including a vertical three-dimensional (3D) memory array of memory cells formed therein, wherein a memory cell is accessed through a word line and a digit line orthogonal to each other, and the digit line is in a form of conductive pillar extending vertically; a pillar selection layer formed under the memory layer and having thin film transistors (TFTs) formed therein for accessing memory cells; and a peripheral circuit layer formed under the pillar selection layer and having a sense amplifier and a decoding circuitry for word lines and bit lines, wherein a TFT is configured for each pillar. In some cases, the TFT is an n-metal-oxide-semiconductor (NMOS) transistor with a drain region coupled to the pillar. In some cases, a channel region of the TFT is extended up to a first predetermined value. In some cases, the TFT has two gate regions with a gate oxide at one side of the channel region and another gate oxide at the other side of the channel region. In some cases, the channel region is formed under the drain region, and a source region is formed under the channel region. In some cases, a length of the channel region is elongated to a second predetermined value. In some cases, the first predetermined value is 120 nm. In some cases, the second determined value is 220 nm. In some cases, a conductive pillar further includes a first sub-pillar and a second sub-pillar separately with each other, and two TFTs are configured for the conductive pillar with one for the first sub-pillar and the other for the second sub-pillar. In some cases, a pitch of the TFTs is compliant with a pitch of the pillars.

In some examples a matrix of thin film transistors (TFTs) is provided under and/or above the digit lines with one transistor for each digit line while a peripheral circuitry is formed under said matrix with sense amplifiers and decoding circuitry for word lines and bit lines.

So, the matrix of thin film transistors is formed in a polysilicon layer while the peripheral circuit layer is realized in a silicon substrate layer; in some examples the peripheral circuit layer may be under said polysilicon layer and the polysilicon layer may be under the 3D memory array.

In some examples, the memory device may include an arrangement of conductive contacts and openings through alternative layers of conductive materials and insulative material that may decrease the spacing between the memory cells while maintaining a dielectric thickness to sustain the voltage to be applied to a memory array of the memory device, and the memory device may also include a selection transistor coupled to each conductive contact, which is the NMOS TFT enabling the decoding of the vertical 3D memory device.

In some examples, the memory device may include a substrate with a set of contacts arranged in a pattern (e.g., a geometric pattern) and a first insulative material (e.g., a dielectric material) formed on the substrate. A set of planes of a conductive material may be separated from one another by a second insulative material (e.g., a dielectric material) and formed on the substrate material. That is, alternating planes of the conductive material and insulative material may be formed on the substrate. The planes of conductive material may be examples of word lines.

During manufacturing of the memory device, one or more trenches may be formed by etching the alternating planes of the conductive material and the insulative material. The trenches may extend parallel to each other and expose the substrate. In some examples the planes of the conductive material and the dielectric materials may form the sidewalls of the trench. The planes of the conductive material may be etched in such a way that the planes of dielectric materials and the conductive materials form a set of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer.

Portions of the sacrificial layer and the insulative may be removed to form first openings. The first openings may expose portions of the substrate, at least some of the set of conductive contacts, and portions of the planes of conductive material and the planes of dielectric material. A storage element material (e.g., the chalcogenide material) may be deposited in the first openings. The storage element material may fill the recesses formed by the planes of dielectric material and the planes of conductive material. The storage element material may be partially removed from the first openings such that the storage element materials in the recesses remain. The storage element material positioned in a recess may be a storage element component (e.g., a chalcogenide component).

Conductive pillars may be formed in the first openings that include the storage components in the recesses. The conductive pillars may be arranged to extend through the planes of the conductive material (e.g., substantially perpendicularly to the planes of the conductive material) and to contact the substrate. Each conductive pillar may contact two storage element components that in turn each contact a same plane of conductive material. Each conductive pillar may further be coupled with one or two conductive contacts, and thus the NMOS TFT may be associated to each conductive pillar. In some cases, the pillars may be formed of a barrier material and a conductive material. In some cases, a single NMOS TFT may be provided for each pillar.

Portions of the conductive pillars may be removed to form second openings. The second openings may divide each pillar into a first pillar and a second pillar. The first and second pillars may be examples of digit lines. The first pillar may be in contact with a first storage element component coupled to a plane of conductive material and the second pillar may be in contact with a second storage element component coupled to the plane of conductive material. In some cases, each of the first pillars and the second pillars may be coupled with a different conductive contact on the substrate. In some other cases, each of the first pillars may be coupled with a different conductive contact on the substrate and each of the second pillars may be coupled with a different conductive contact on a second substrate formed above the first substrate. In some cases, each of the first pillars and the second pillars may be associated to a respective NMOS TFT. In other words, one pillar may have a single NMOS TFT coupled thereto.

In some cases, the NMOS TFT may be formed under the array of the memory cells, in particular under each pillar. In some cases, a drain region of the NMOS TFT may be coupled to the pillar. In some cases, an active area (i.e., a polysilicon channel) of the NMOS TFT may be extended up to a predetermined value (e.g., 120 nm). In some cases, the NMOS TFT may have two gate regions with a gate oxide at one side of the channel region and another gate oxide at the other side of the channel region, thus doubling the width of the NMOS TFT. In some cases, a first bottom silicon layer of the memory device may be dedicated to a sense amplifier and a decoding circuitry for the word lines and bit lines. In some cases, over the first silicon layer, an epitaxial grow of polysilicon may be provided, and in this polysilicon layer, the NMOS TFTs may be provided as a sort of matrix under the pillars.

The present disclosure further relates to a method for accessing a memory cell of the vertical 3D memory device having an NMOS TFT selector. Generally, a cell of the 3D memory array may be addressed by a word line and a bit line. In order to address a target cell, a positive biasing voltage may be applied to a digit line (that may be a vertical portion of a bit line), and a negative biasing voltage may be applied to a word line plate. However, the word line receiving the negative biasing voltage may be in common with all the other cells associated to the same word line plate and linked to other pillars (i.e., vertical portions of bit lines). Thus, it is necessary to determine a desired bit line.

It is possible to select a single cell with a single NMOS TFT while de-selecting all the others according to the accessing method which will be described below in detail. Thus, it is also possible to bias the set voltage or the program and reset voltage as well as the reading voltage. The disclosed solution is also suitable to select a single cell when a negative biasing voltage is applied to a digit line (that may be a vertical portion of a bit line), and a positive biasing voltage is applied to a word line plate.

FIG. 1 illustrates an example of a memory array 100 (e.g., a three-dimensional (3D) memory array) that supports a vertical 3D memory device having an NMOS TFT selector in accordance with examples as disclosed herein. Memory array 100 may include a first array or deck 105 of memory cells that is positioned above a substrate 104 and a second array or deck 108 of memory cells on top of the first array or deck 105.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a vertical cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a set of contacts arranged in a grid or staggered pattern. In some cases, the set of contacts may extend through the substrate and couple with an access line of the memory array 100. The memory array 100 may include an additional substrate 104 (e.g., positioned above the two decks 105 and 108. The additional substrate 104 may have a set of contacts (e.g., extending through the substrate) and coupled with an access line of the memory array 100.

The memory array 100 may include a set of planes of a conductive material separated by one another by a second insulative material formed on the first insulative material on the substrate material. Each of the set of planes of the conductive material may include a set of recesses formed therein. The set of planes, for example, word line plates corresponding to one or more word lines 110 on a same deck (e.g., memory deck 105, memory deck 108), may be obtained by a replacement process by using a sacrificial layer (e.g., a conformal layer) for etching during a stack deposition processing step, removing the conformal layer after cell definition and replacing the conformal layer with a more conductive material.

A set of conductive pillars may be formed in openings to extend substantially perpendicular to the set of planes of the conductive material and the substrate. The set of conductive pillars may be divided into a set of pillar pairs. Each pillar in the pair of pillars may be coupled to a different one of the conductive contacts. In some cases, each pillar in the pair of pillars may be coupled to a conductive contact on substrate 104. Additionally or alternatively, one pillar of each pair of pillars may be coupled to a conductive contact on the substrate 104 and the other pillar of each pair of pillars may be coupled to a conductive contact on a different substrate 104 (e.g., positioned above the memory decks 105 and 108).

In some examples, the memory decks 105 and 108 may include chalcogenide material configured to store logic states. For example, the memory cells of the memory decks 105 and 108 may be examples of self-selecting memory cells. A chalcogenide material may be formed in the set of recesses such that the chalcogenide material in each respective one of the set of recesses is at least partially in contact with one pillar of the set of pairs of pillars.

FIGS. 2A-2F illustrate various views of example memory arrays 200-*a*, 200-*b*, 200-*c*, and 200-*d* during a series of steps or processes that may be performed to form a stacked memory device, in accordance with examples as disclosed herein. Specifically, in FIGS. 2A-2F, a process of forming word line planes, depositing a sacrificial layer, and an insulative material is shown.

Figure 2A:
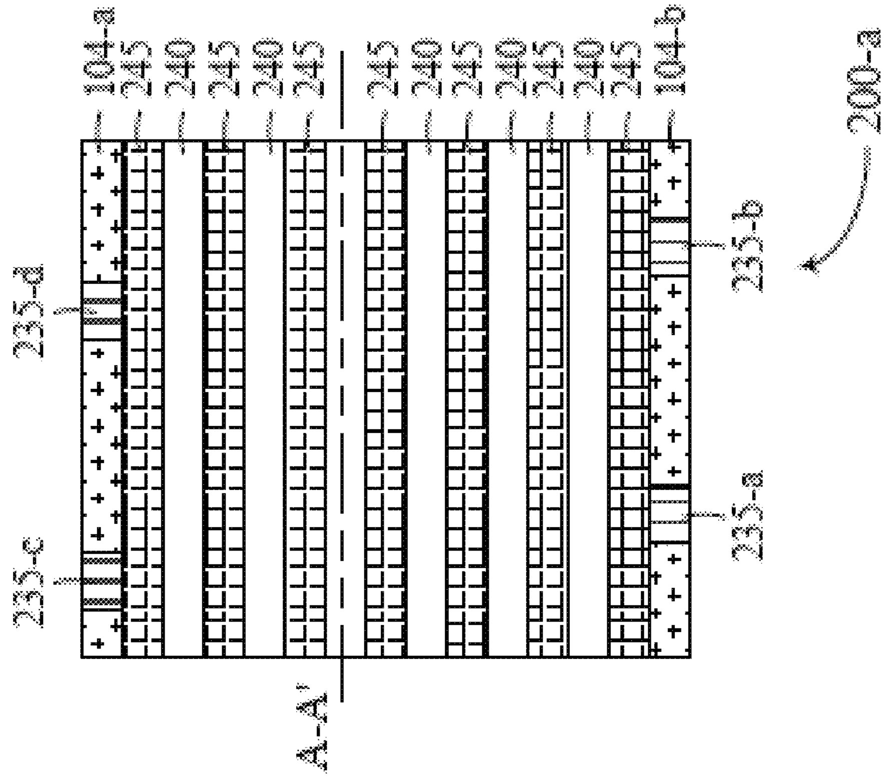
FIGS. 2A through 2F illustrate various views of example memory arrays that support a vertical 3D memory device having an NMOS TFT selector in accordance with examples as disclosed herein.
Figure 2B:
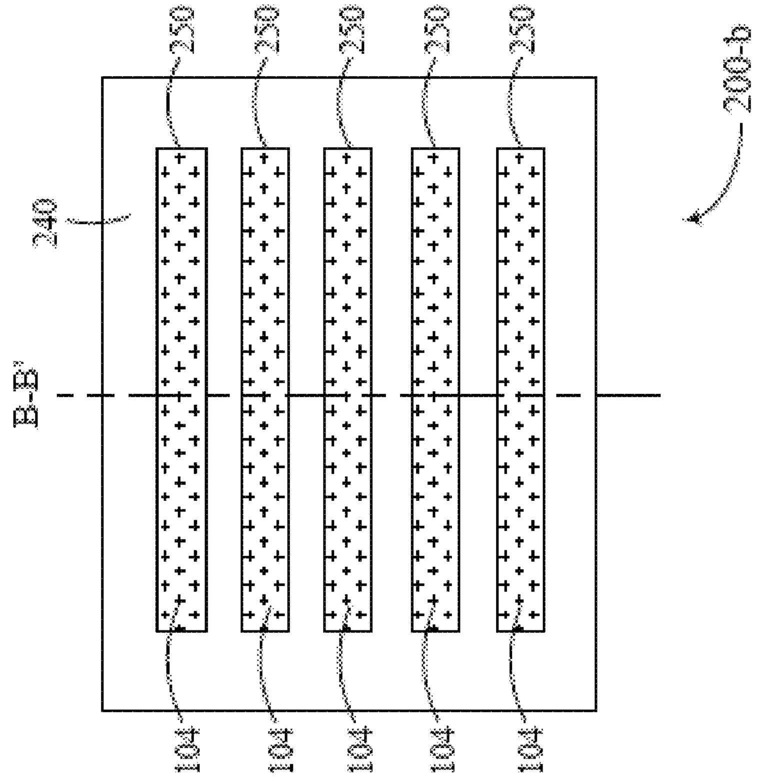
Figure 2C:
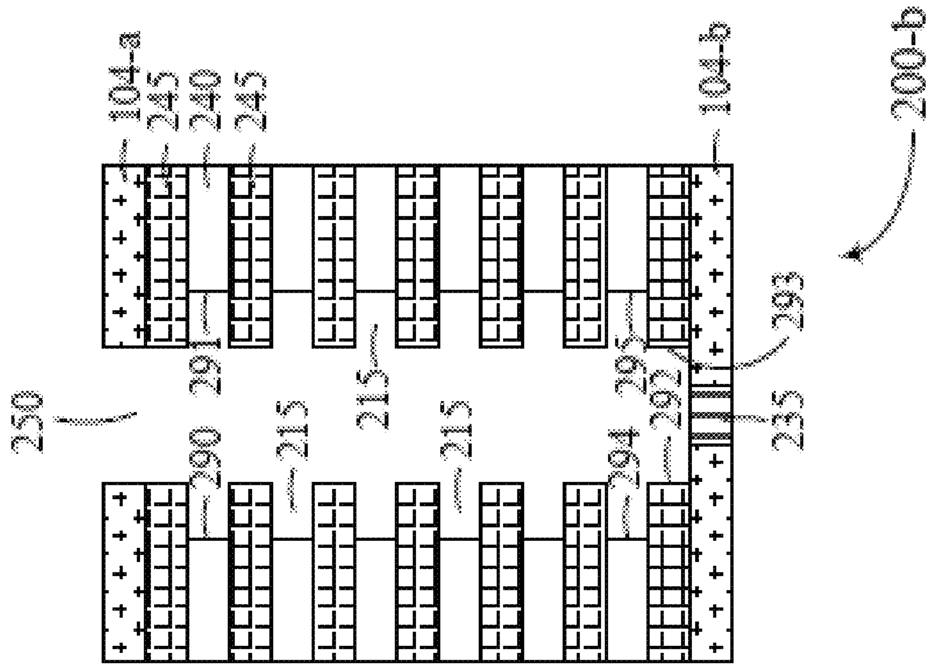
Figure 2D:
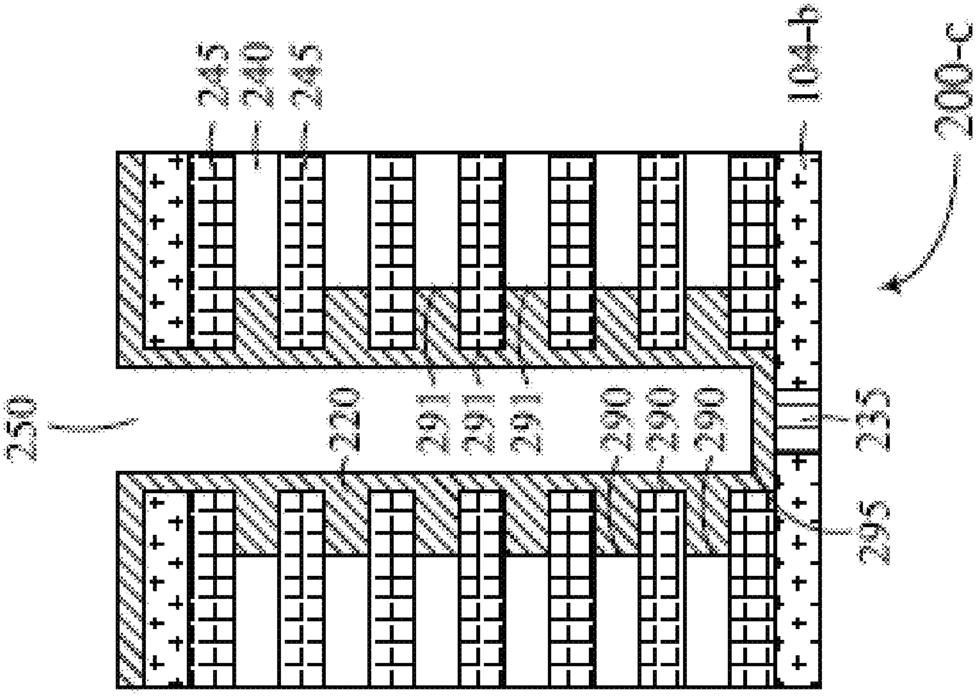
Figure 2E:
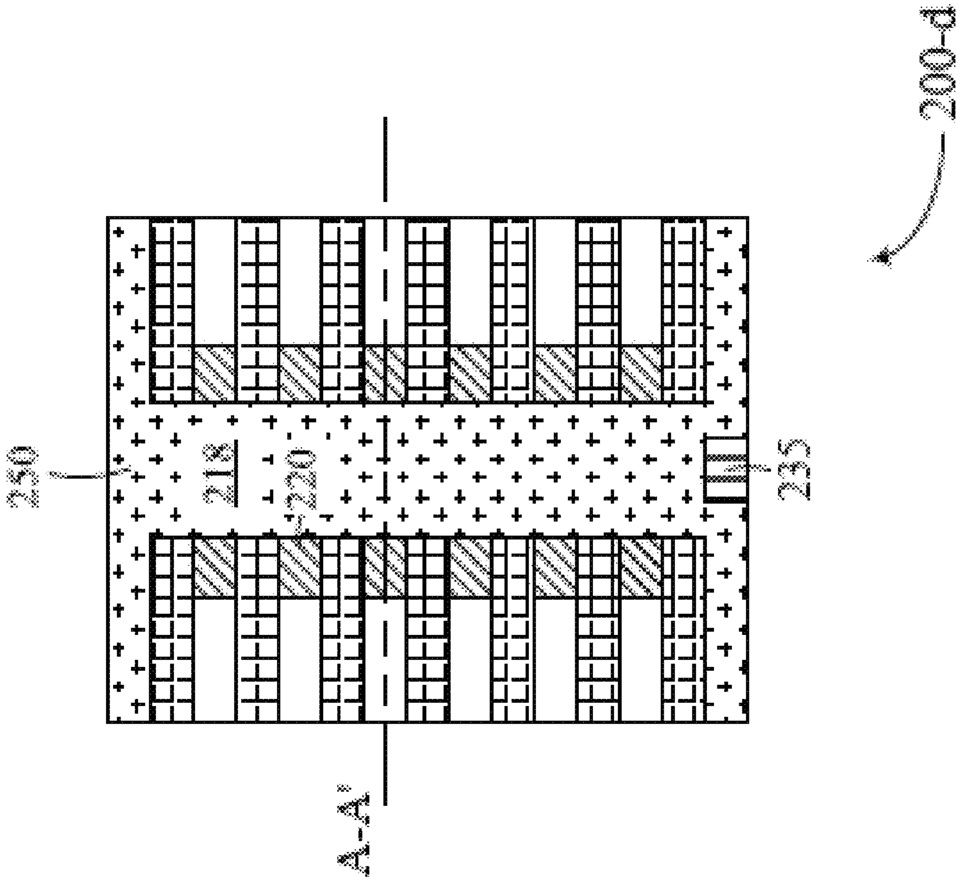
Figure 2F:
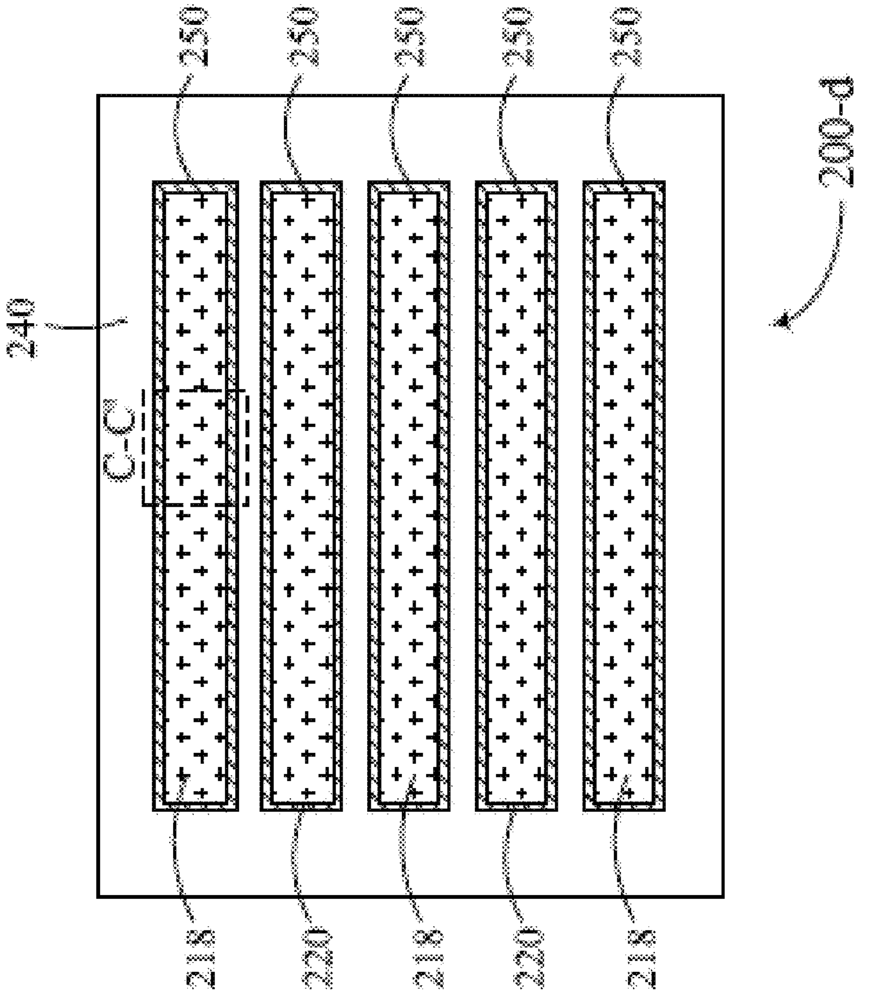

FIG. 2A illustrates a side view of an example memory array 200-*a*. FIG. 2B illustrates a top view of an example memory array 200-*b* along a section line A-A' of FIG. 2A during a process step subsequent to what is illustrated in FIG. 2A. FIG. 2C illustrates a cross-sectional view of memory array 200-*b* (e.g., as shown in FIG. 2B) taken along a section line B-B' of FIG. 2B. FIG. 2D illustrates a cross-sectional view of memory array 200-*c* taken along section line B-B' of FIG. 2B during a process step subsequent to what is illustrated in FIGS. 2B and 2C. FIG. 2E illustrates a cross-sectional view of memory array 200-*d* taken along section line B-B' of FIG. 2B during a process step subsequent to what is illustrated in FIG. 2D. FIG. 2F illustrates a top view of an example memory array 200-*d* (e.g., as shown in FIG. 2D) along a section line A-A' of FIG. 2E.

FIG. 2A illustrates a side view of an example memory array 200-*a* in accordance with examples as disclosed herein; for example memory array 200-*a* may support a vertical 3D memory device having an NMOS TFT selector. The memory array 200-*a* may include a set of conductive contacts 235 that extend through the substrates 104-*a* or 104-*b*. The memory array 200-*a* may further include alternating layers of material 240 and insulative material 245 (e.g., an insulative material layer, a dielectric layer). In some cases, the material 240 may be a conductive material (e.g., to form a conductive layer). In other cases, the material 240 may be a sacrificial insulative material (e.g., different than insulative material 245).

The substrate 104 may be a dielectric material, such as a dielectric film. A single conductive contact of the set of conductive contacts 235 may be configured to couple any single vertical pillar (e.g., a digit line) with a transistor (e.g., a selecting transistor or digit line selector).

In some examples, conductive contacts 235 may be formed in both substrates 104-*a* and 104-*b*. For example, conductive contact 235-*a* may couple a first pillar of a pair of pillars (e.g., corresponding to a digit line) to a transistor. Conductive contact 235-*c* may couple a second pillar of the pair of pillars to a transistor. Conductive contact 235-*b* and conductive contact 235-*d* may each couple one pillar of a second pair of pillars to transistors. Additionally or alternatively, each of the conductive contacts 235 may extend through the substrate 104-*b* (e.g., conductive contacts 235-*c* and 235-*d* may be formed through the substrate 104-*b*). For example, conductive contact 235-*a* may couple a first pillar of a pair of pillars to a transistor and contact 235-*b* may couple a second pillar of the pair of pillars to a transistor.

The set of conductive contacts 235 may be arranged in a grid pattern. In some examples, a respective one of the set of conductive contacts 235 may be surrounded by up to eight other conductive contacts 235. Additionally or alternatively, the set of conductive contacts 235 may be arranged in a staggered pattern or a hexagonal pattern. For example, a respective one of the set of conductive contacts 235 may be surrounded by up to six other conductive contacts 235.

The memory array 200-*a* may also include a set of stacked planes of insulative material 245 and a set of stacked planes of a material 240 (e.g., word lines planes or word line plates), where the material 240 may be a conductive material or an insulative material (e.g., to be replaced by a conductive material during a process step subsequent to what is illustrated in FIG. 2A). The stacked planes of material 240 may be separated in a z-direction (e.g., separated vertically) from one another by the set of planes of the insulative material 245. For example, a first plane (e.g., a bottom plane) of the second insulative material 245 may be formed (e.g., deposited) on the plane of the substrate 104-*b*, and then a plane of the material 240 may be formed on the first plane of the second insulative material 245. In some examples, a layer of the first insulative material 245 may be deposited on the substrate 104-*b*. In some examples, the material 240 may be a layer of conductive carbon or other conductive layer compatible with active materials. In some examples, the material 240 may include conductive layers separated by active material through a protective barrier. Each layer of the material 240 may be configured to function as at least one word line plate. In some examples, the material 240 and the insulative material 245 form a set of layers, such as alternating layers.

Alternatively, the material 240 may be a sacrificial insulative material. Here, the memory array 200-*a* may include a set of stacked planes of the sacrificial insulative material 240 and a set of stacked planes of the insulative material 245. The sacrificial insulative material 240 may be a different material than the insulative material 245 (e.g., an oxide material and a nitride material, respectively). During a process step subsequent to what is illustrated in FIG. 2A, the sacrificial insulative material 240 may be removed and replaced by a conductive material (e.g., a layer of conductive carbon or other conductive layer compatible with active materials).

Additional planes of the second insulative material 245 may be formed on the material 240 in an alternating manner as illustrated in FIG. 2A. The second insulative material 245 may be a dielectric material, such as a dielectric film or layer. In some examples, the second insulative material 245 and the substrate 104-*a* may be the same type of insulative material. Examples of the insulative materials disclosed herein include, but are not limited to dielectric materials, such as silicon oxide.

Each respective one of the set of planes of the material 240 may be at (e.g., form) a different level of the memory array 200-*a*. Individual planes of material that form memory cells may be referred to as a deck of the 3D memory array 200-*a*. The material 240 (e.g., a conductive material) may comprise (e.g., be formed of) a metallic (or semi-metallic) material or a semiconductor material such as a doped polysilicon material, among others. In some examples, the material 240 may be a plane of conductive carbon.

Six planes of the material 240 and seven planes of the second insulative material 245 are shown in FIG. 2A. The seventh plane of the second insulative material 245 may be a topmost layer of the memory array 200-*a*. The quantity of planes of the material 240 and the second insulative material 245 are not limited to the quantities illustrated in FIG. 2A. The material 240 and the second insulative material 245 may be arranged into more than six decks or less than six decks.

FIG. 2B illustrates a top view of a memory array 200-*b* along section line A-A' of FIG. 2A. FIG. 2B shows the formation trenches 250 through the alternating planes of material 240 (e.g., a conductive material, an insulative material) and the second insulative material 245 of memory array 200-*b*. The trench 250 may expose the substrate 104 and the conductive contacts 235 (previously shown in FIG. 2A) at the bottom of the trench 250. The trenches 250 may be etched from top to bottom and etched in a linear shape. In some cases, the trenches 250 may be formed by a combination of vertical and horizontal etching processes to form recesses within the trenches 250. Additional details about the etching processes and recesses are shown and described with reference to FIG. 2C. The trenches 250 may form a set of openings extending in a substantially parallel direction on each plane of the material 240 (e.g., word line plane, conductive layer).

FIG. 2C illustrates a side view of the memory array 200-*b* taken along the line B-B' of FIG. 2B. The memory array 200-*b* illustrates forming a set of recesses 215 in the material 240 (e.g., a conductive material, an insulative material) in each of the planes of memory array 200-*b*. For example, a selective etching operation may be performed to form the set of recesses 215 in sidewalls 290 and 291 of the trench 250 in an isotropic way. In some examples, the trench 250 includes a first sidewall 290 spaced apart from a second sidewall 291, where a first portion 292 of the first sidewall 290 formed by the first insulative material 245 is spaced apart from a first portion 293 of the second sidewall 291 formed by the first insulative material 245 by a first distance. A second portion 294 of the first sidewall 290 formed by the first material 240 may be spaced apart from a second portion 294 of the second sidewall 291 formed by the first material 240 by a second distance greater than the first distance. In some examples, portions of sidewalls 290 and 291 of the trench 250 formed by the first material 240 are recessed relative to portions of the sidewalls 290 and 291 of the trench 250 formed by the first insulative material 245.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 250 to expose the substrate 104-*b* and one or more conductive contacts 235 and a horizontal etching process may be used to form at least one recess 215 in at least one material 240. The etching parameters may be selected such that the material 240, for example, is etched faster than the second insulative material 245.

FIG. 2D illustrates a side view of the memory array 200-*b* taken along the line B-B' of FIG. 2B. The memory array 200-*c* illustrates forming a conformal material 220 (e.g., a sacrificial material or sacrificial layer). The conformal material 220 may be deposited into the trench 250 of memory array 200-*c*. The conformal material 220 may be formed in the recesses 215 as shown in FIG. 2C by conformally depositing the conformal material 220. The conformal material 220 contacts a first sidewall 290, a second sidewall 291, and a bottom wall 295 of each trenches 250 (e.g., in contact with the substrate 104-*b* and contact 235). Although FIG. 2D shows the conformal material 220 formed on the sidewalls of the trench 250 (e.g., on the surfaces of the second insulative material 245 and the materials 240 in different layers facing into the trench 250), examples are not so limited. For example, the conformal material 220 may be confined to the set of recesses 215 in the materials 240 (e.g., conductive materials, insulative materials) in different layers in some cases. In some cases, the conformal material 220 may be referred to as a conformal layer or a sacrificial layer.

In some cases, an etching operation may be performed subsequent to forming the conformal material 220. In the etching operation, the conformal material 220 may be etched to form an opening or trench 250. The etch operation may result in the surfaces of the conformal material 220 (e.g., the surfaces facing the trench 250) being spaced apart from the surfaces of the second insulative material 245 (e.g., the surfaces facing into the trench 250). In some cases, the etch operation may result in the surfaces of the conformal material 220 (e.g., the surfaces facing the trench 250) being approximately coplanar with surfaces of the second insulative material 245 (e.g., the surfaces facing into the trench 250), and thereby forming a continuous sidewall of trench. The etch operation may further result in the substrate 104-*b* and the contact 235 being exposed (e.g., removing the conformal material 220 from bottom wall 295 of the trenches 250. The etching operations described herein may be vertical etching processes (e.g., an anisotropic etching process or a dry etching process, or a combination thereof) or horizontal etching processes (e.g., an isotropic etching process). For example, a vertical etching process may be performed to vertically etch the trench 250 and a horizontal etching process may be used to form at least one recess in the first material 240 (e.g., the first conductive material 240, a sacrificial insulative material 240).

FIG. 2E illustrates a side view of the memory array 200-*b* taken along the line B-B' of FIG. 2B. The memory array 200-*d* illustrates depositing a dielectric material 218 in the trench 250 on top of the conformal material 220 of the memory array 200-*d*. The dielectric material 218 may contact the conformal material 220. The dielectric material 218 may further contact one or more contacts 235. The dielectric material 218 and the conformal material 220 may cooperate to fill the trench 250. In some cases, the dielectric material 218 may be an example of an insulative material. In some examples, the conformal material 220 may be etched back selectively to form a co-planar surface with the dielectric material 218. The depth of the recession may be defined depending on a desired thickness.

FIG. 2F illustrates a top view of the example memory array 200-*d* along section line A-A' of FIG. 2E. FIG. 2F illustrates the memory array 200-*d* after the dielectric material 218 is deposited into a set of trenches 250. Each of the trenches 250 of memory array 200-*d* are lined with the conformal material 220 and filled with the dielectric material 218. The trenches 250 may extend through each of the layers of the material 240 (e.g., the conductive material 240, the sacrificial insulative material 240) as shown in FIG. 2E.

FIGS. 3A-3I illustrate various views of example memory arrays 200-*e*, 200-*f*, 200-*g*, 200-*h*, and 200-*i* during a series of steps or processes that may be performed to form a stacked memory device, in accordance with examples as disclosed herein.

Figure 3A:
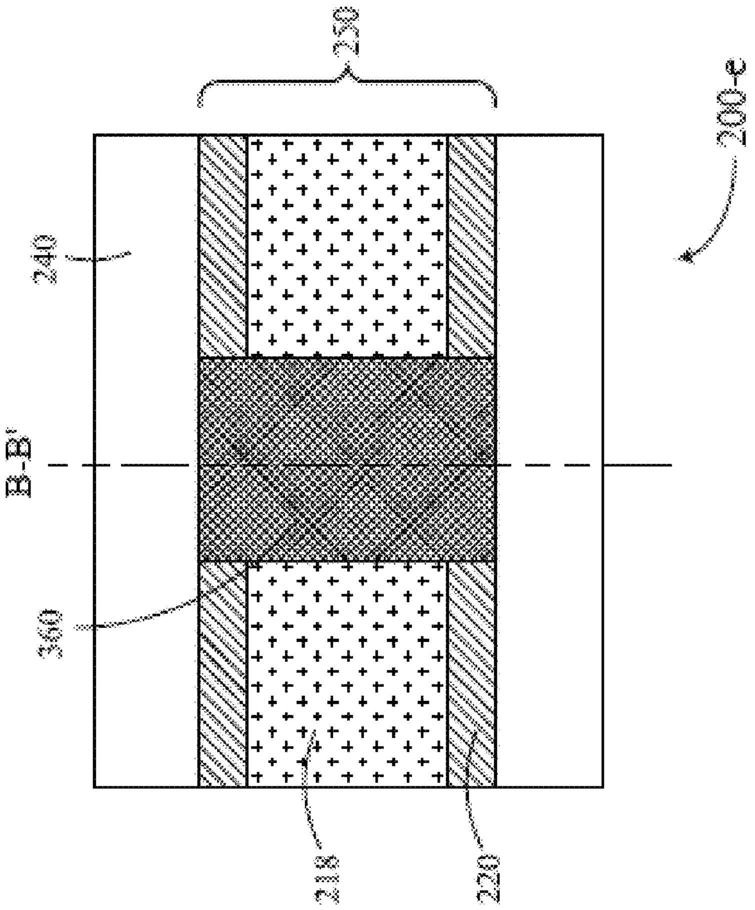
FIGS. 3A through 3I illustrate various views of example memory arrays that support a vertical 3D memory device having an NMOS TFT selector in accordance with examples as disclosed herein.
Figure 3B:
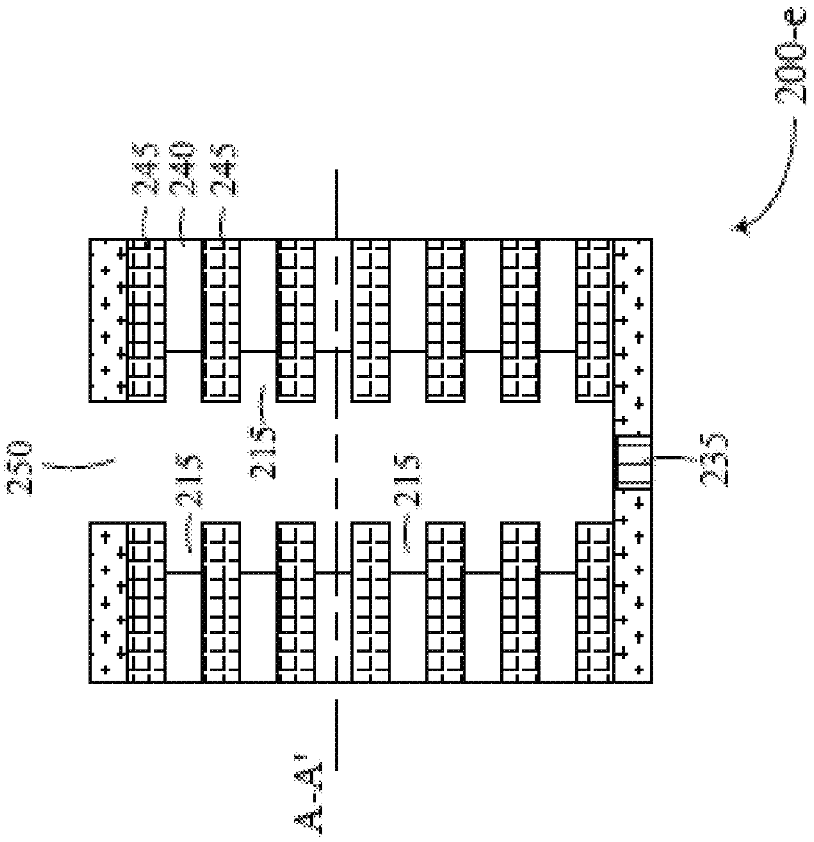
Figure 3C:
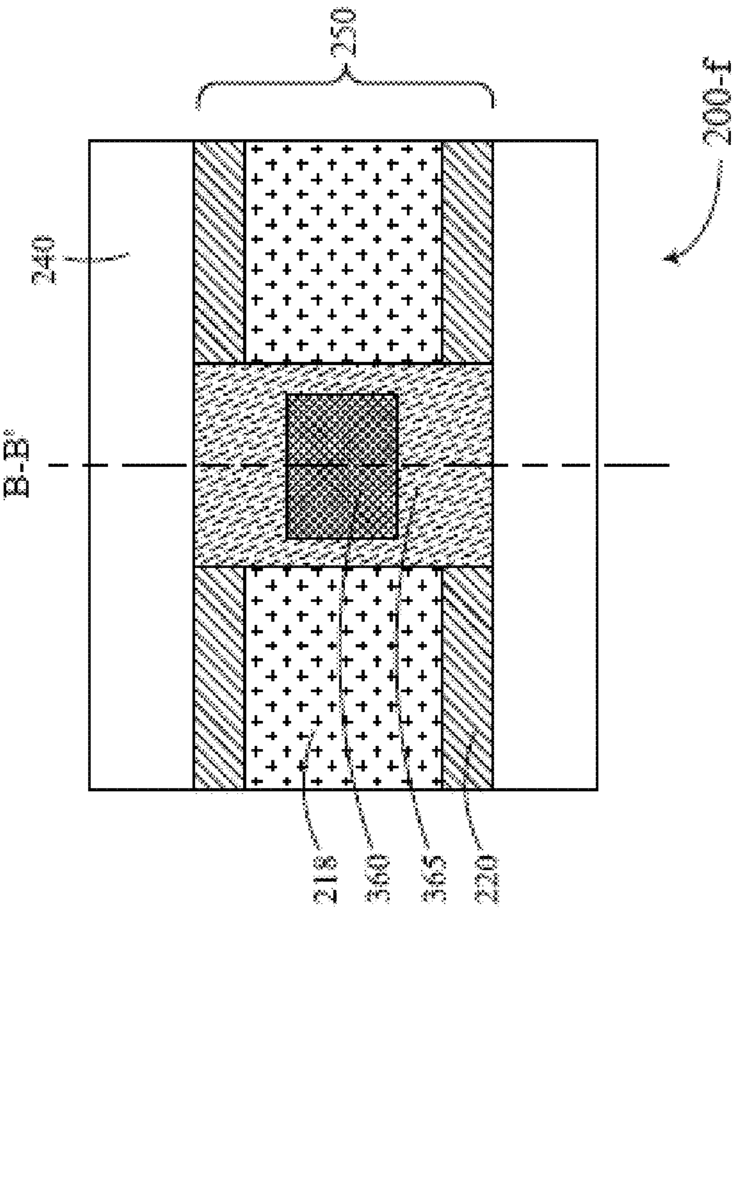
Figure 3D:
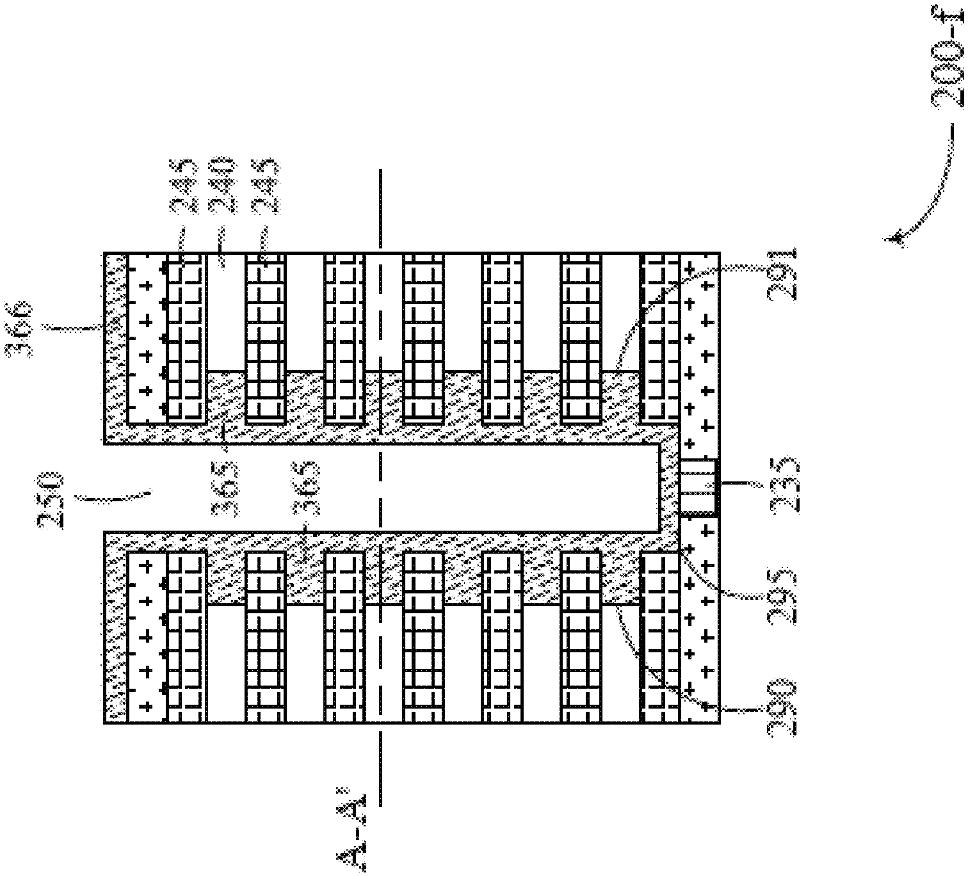
Figure 3E:
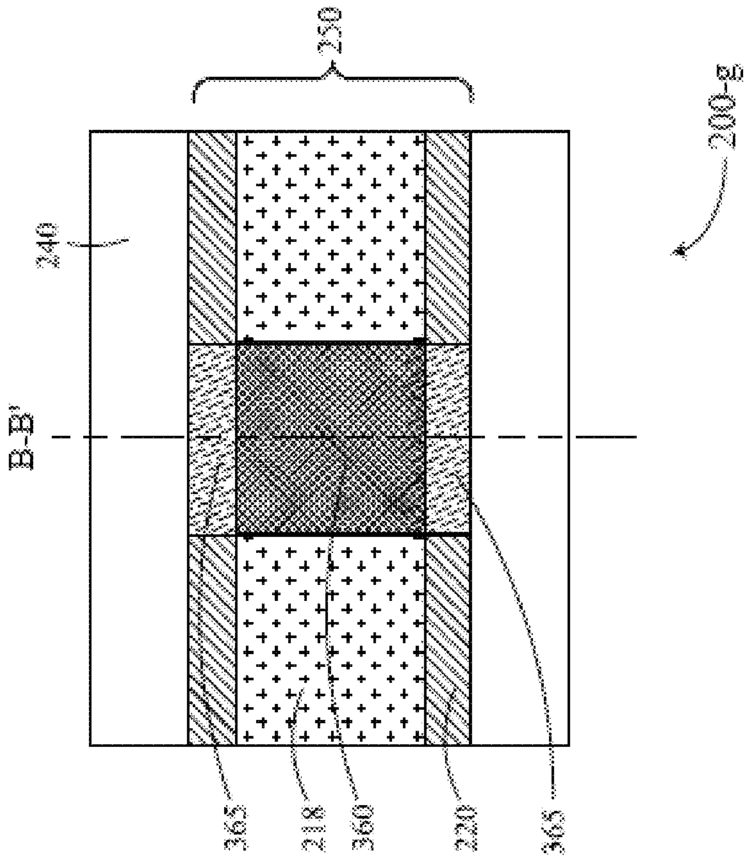
Figure 3F:
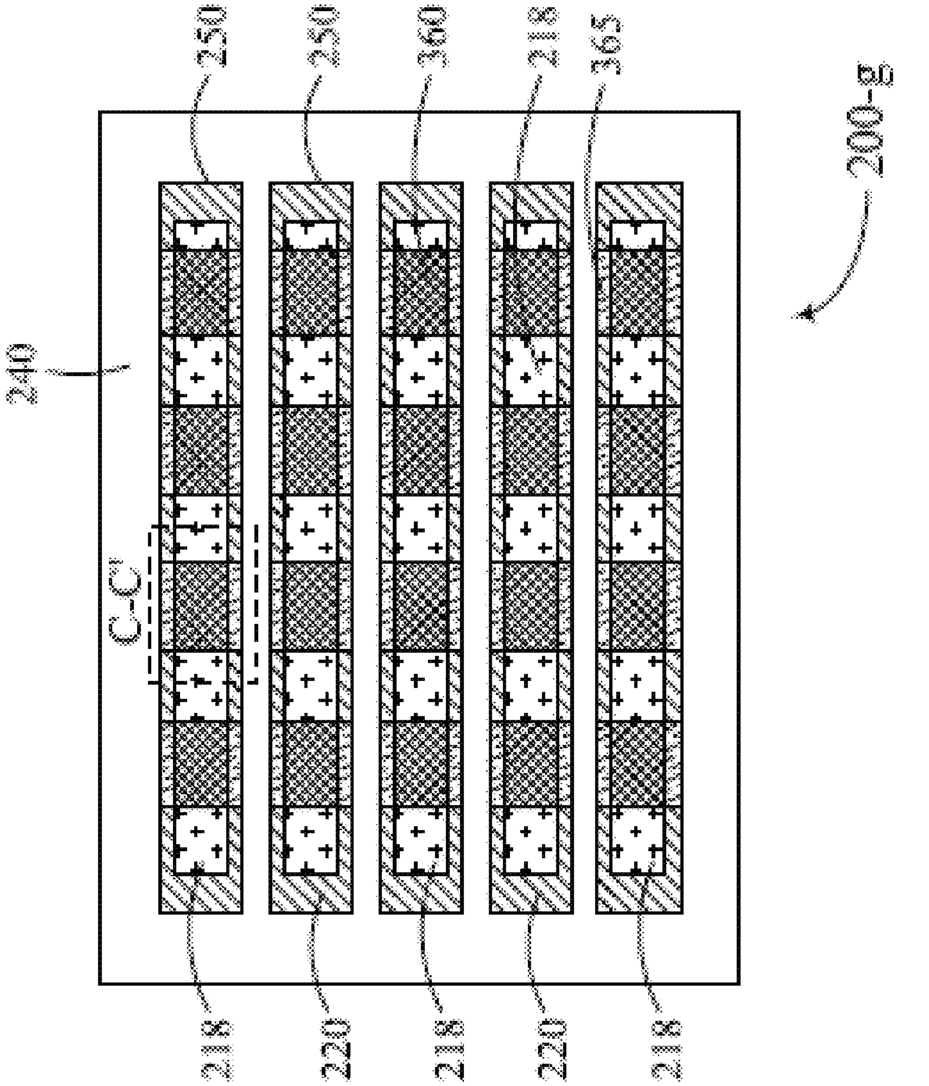
Figure 3G:
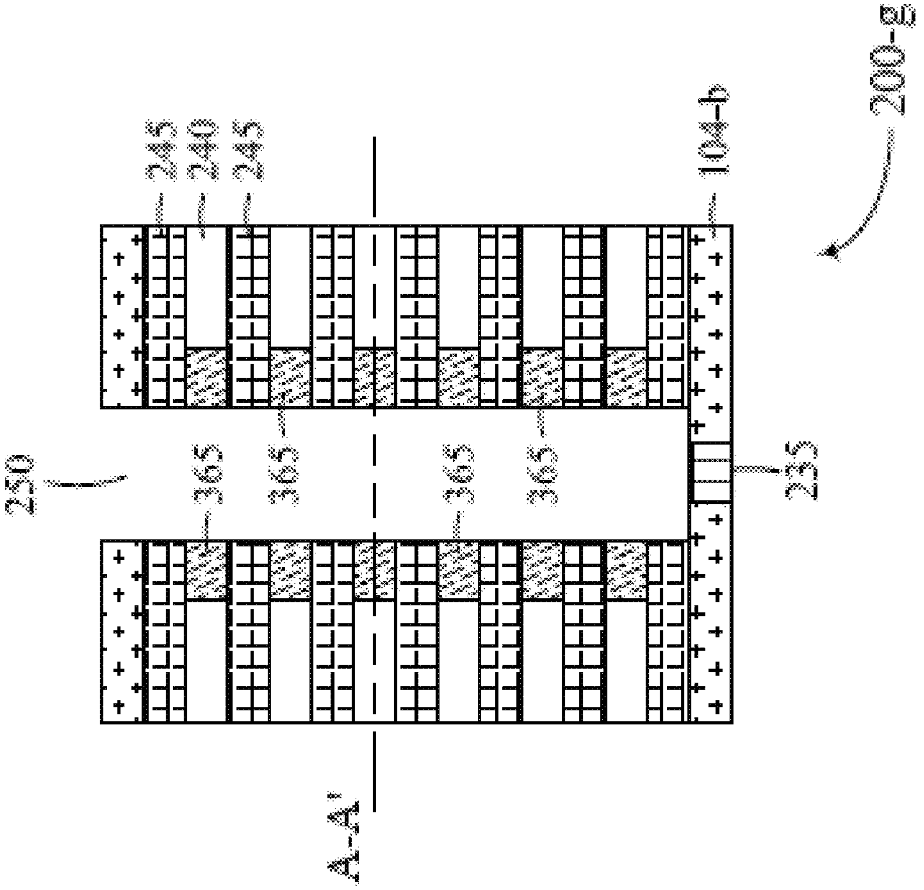
Figure 3H:
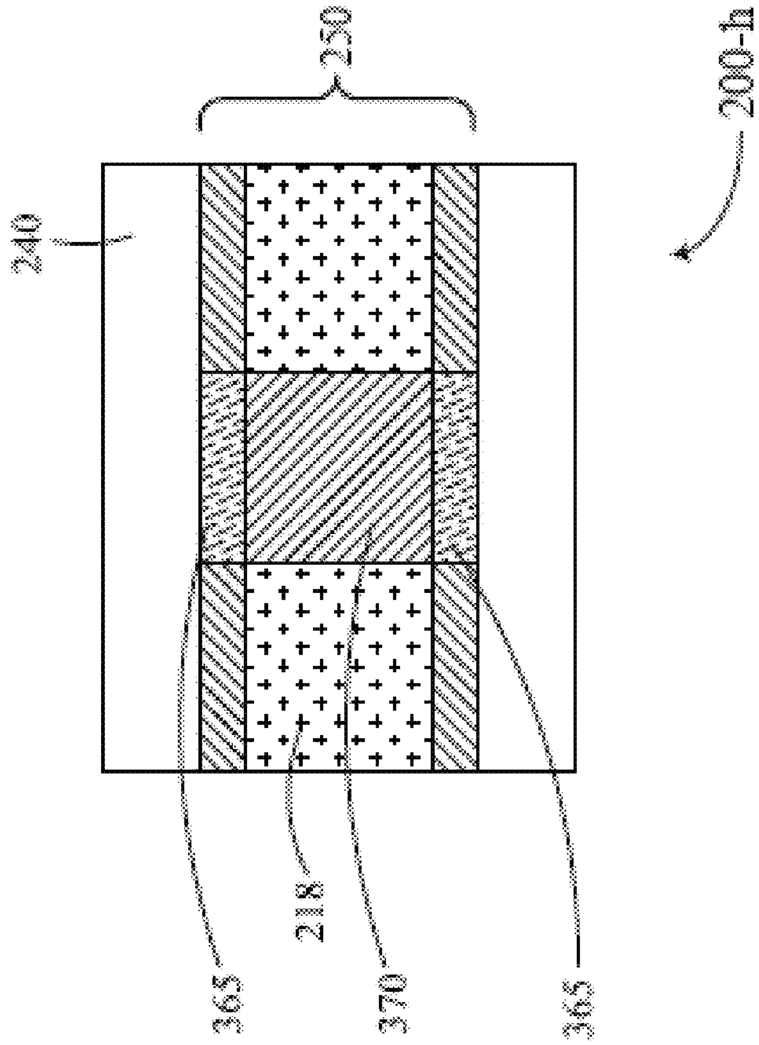
Figure 3I:
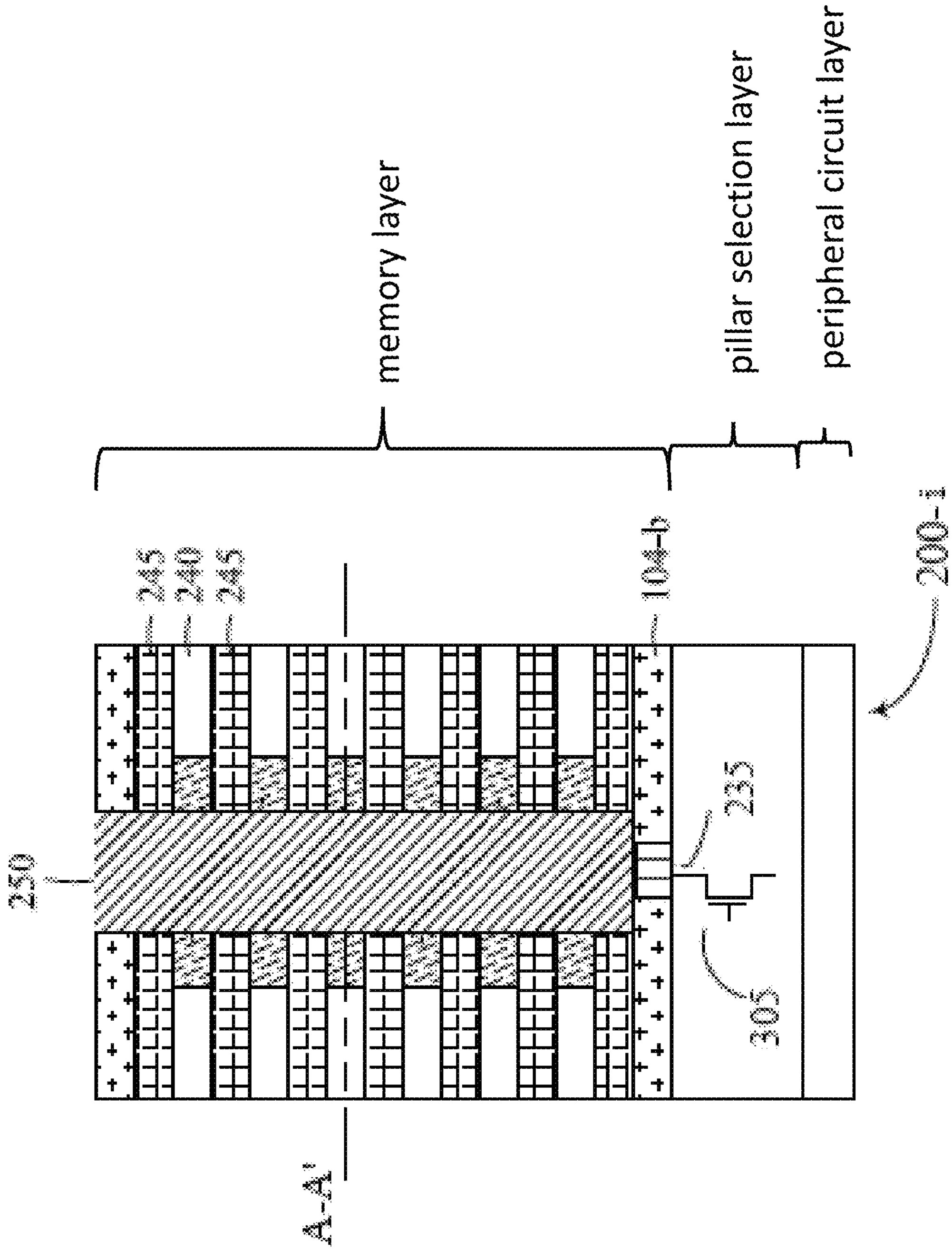

FIG. 3A illustrates a section C-C' of FIG. 2F of the top view of an example memory array 200-*e* during a process step subsequent to what is illustrated in FIG. 2F. FIG. 3B illustrates a cross-sectional view of the example memory array 200-*e* along section line B-B' of FIG. 3A. FIGS. 3C and 3D illustrate an example memory array 200-*f* during a process step subsequent to what is illustrated in FIGS. 3A and 3B. FIG. 3C illustrates a section C-C' (illustrated in FIG. 2F) of the top view of the example memory array 200-*f* and FIG. 3D illustrates a cross-sectional view of the example memory array 200-*f* along section line B-B' of FIG. 3C. FIGS. 3E, 3F, and 3G illustrate an example memory array 200-*g* during a process step subsequent to what is illustrated in FIGS. 3C and 3D. FIG. 3E illustrates a section C-C' (illustrated in FIG. 2F) of the top view of the example memory array 200-*g* (e.g., along section line A-A' of FIG. 3D). FIG. 3F illustrates the top view of the example memory array 200-*g* and FIG. 3G illustrates a cross-sectional view of the example memory array 200-*g* along section line B-B' of FIG. 3E. FIG. 3H illustrates a section C-C' of FIG. 3F of the top view of an example memory array 200-*h* during a process step subsequent to what is illustrated in FIGS. 3E, 3F, and 3G. FIG. 3I illustrates an example memory array that support a vertical 3D memory device having an NMOS TFT selector in accordance with examples as disclosed herein.

FIG. 3A illustrates a section C-C' of FIG. 2F of the top view of an example memory array 200-*e*. Example memory array 200-*e* may show the section C-C' of the example memory array 200-*d* as shown in FIG. 2F during a processing step subsequent to what is illustrated in FIGS. 2E and 2F. Opening 360 may be formed in a trench 250 by etching away a portion of the dielectric material 218 and/or the conformal material 220. The opening 360 may be positioned over one or more of the contacts 235 so that forming the opening 360 exposes at least a portion of one of the contacts 235. Additional details about the relationship between the openings 360 and the contacts 235 is shown and described with reference to FIG. 3B. In some cases, the example memory array 200-*e* may include a set of openings 360. For example, a set of openings may be formed at intervals along each of the trenches 250. Each of the openings 360 within a trench 250 may be separated from other openings in the trench 250 by the dielectric material 218. The etching process to form the openings 360 may be a vertical etching process. In some examples, the etching operation may not etch away all portions of the conformal material 320, for example, where the openings 360 are not formed.

FIG. 3B illustrates a side view of the memory array 200-*e* taken along the line B-B' of FIG. 3A. As shown in FIG. 3B, a set of recesses 215 may be formed in the material 240 in each of the planes. The set of recesses 215 may be formed during a formation of the openings 360 (e.g., as discussed with reference to FIG. 3A). For example, a selective etching operation may be performed to form the set of recesses 215 in a full or partially isotropic way. The etching chemistry may be selected to selectively reach a material 240. The contacts 235 may be exposed by forming the openings 360 in in the trench 250.

FIG. 3C illustrates a top view of section C-C' illustrated in FIG. 2F of an example memory array 200-*f* in accordance with examples as disclosed herein. The top view may be a view taken along section line A-A' of FIG. 3B. Example memory array 200-*f* may be formed subsequent to the processing step illustrated in FIGS. 3A and 3B by example memory array 200-*e*. As shown in FIG. 3C, a storage element material 365 may be formed in the opening 360. In some cases, the storage element material 365 may extend to contact each sidewall of the material 240. The storage element material 365 may further contact the conformal material 220 and the dielectric material 218. Forming the storage element material 365 in the opening 360 (e.g., by depositing the storage element material 365 in the opening 360) may decrease the size of the opening 360.

The storage element material 365 may be an example of a chalcogenide material, such as a chalcogenide alloy and/or glass, that may serve as a self-selecting storage element material (e.g., a material that may serve as both a select device and a storage element). For example, the storage element material 365 may be responsive to an applied voltage, such as a program pulse. For an applied voltage that is less than a threshold voltage, the storage element material 365 may remain in an electrically nonconductive state (e.g., an "off" state). Alternatively, responsive to an applied voltage that is greater than the threshold voltage, the storage element material 365 may enter an electrically conductive state (e.g., an "on" state).

FIG. 3D illustrates a side view of the memory array 200-*f* taken along the line B-B' of FIG. 3C. A storage element material 365 may be formed in the set of recesses 215 by conformally depositing the storage element material 365 into the trench 250. The storage element material 365 may be deposited to contact sidewalls 290 and 291 and a bottom wall 295 of the trench 250 exposed by the etching of the conformal material 320. When the storage element material 365 contacts the bottom wall 295 of the trench 250, the storage element material 365 covers the exposed contacts 235. The storage element material 365 may include atop layer 366.

FIG. 3E illustrates a section C-C' (illustrated in FIG. 2F) of the top view of the example memory array 200-*g* (e.g., along section line A-A'). An etching operation may be performed on the example memory array 200-*f* illustrated in FIGS. 3C and 3D to generate example memory array 200-*g*. The etching operation may remove portions of the storage element material 365 to create storage element components (e.g., including the storage element material 365). Each of the storage element components of the storage element material 365 may be in contact with a layer of the material 240 (e.g., a conductive material 240). In some examples, portions of the conformal material 220 may be located on either side of the storage element component of the storage element material 365. The etching of the storage element material 365 may separate the storage element components of the storage element material 365 by opening 360. The storage element components may enable the memory array 200-*g* (and memory arrays 200 formed by processing steps subsequent to memory array 200-*g*) to store data. That is, the storage element component may include the storage element material 365 and may be configured to store a logic state (e.g., a logic value '0' or logic value '1').

The storage element component may be programmed to a target state by applying a pulse (e.g., a programming pulse) that satisfies a programming threshold. The amplitude, shape, or other characteristics of the programming pulse may be configured to cause the storage element material 365 to exhibit the target state. For example, after applying the programming pulse, the ions of the storage element component may be redistributed throughout the storage element, thereby altering a resistance of the memory cell detected when a read pulse is applied. In some cases, the threshold voltage of the storage element component may vary based on applying the programming pulse.

The state stored by the storage element component may be sensed, detected, or read by applying read pulse to the storage element component. The amplitude, shape, or other characteristics of the read pulse may be configured to allow a sense component to determine what state is stored on the storage element component. For example, in some cases, the amplitude of the read pulse is configured to be at a level that the storage element component will be in an "on" state (e.g., current is conducted through the material) for a first state but will be in an "off" state (e.g., little to no current is conducted through the material) for a second state.

In some cases, the polarity of the pulse (whether programming or read) applied to the storage element component may affect the outcomes of the operation being performed. For example, if the storage element component stores a first state, a read pulse of a first polarity may result in the storage element component exhibiting an "on" state while a read pulse of a second polarity may result in the storage element component exhibiting an "off" state. This may occur because of the asymmetrical distributions of ions or other material in the storage element component when it is storing a state. Similar principles apply to programming pulses and other pulses or voltages.

Examples of chalcogenide materials that may serve as the storage element component include indium (In)-antimony (Sb)-tellurium (Te) (IST) materials, such as $In_2Sb_2Te_5$, $In_1Sb_2Te_4$, $In_1Sb_4Te_7$, etc., and germanium (Ge)-antimony (Sb)-tellurium (Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

FIG. 3F illustrates a top view of the example memory array 200-*g* along section line A-A' of FIG. 3D. FIG. 3F includes the section C-C' illustrated in FIG. 3E. Example memory array 200-*g* shows a set of trenches 250. Each of the trenches 250 includes a set of storage element components of the storage element material 365. The set of storage element components may be separated from other storage element components by openings 360 and dielectric material 218. The storage element components may be in contact with the conformal material 220.

FIG. 3G illustrates a side view of the memory array 200-*g* taken along the line B-B' of FIG. 3F. The etching operation may be performed subsequent to forming the storage element material 365 (e.g., as discussed with reference to FIGS. 3C and 3D) so that surfaces of the storage element material 365 (e.g., the surfaces facing into the trench 250) are approximately coplanar with surfaces of the layers of insulative material 245 (e.g., the surfaces facing into the trench 250). The etching of the storage element material 365 may form a continuous sidewall and remove the top layer 366 of the storage element material 365 as shown in FIG. 3D. The etching of the storage element material 365 may also expose the contacts 235 in the substrate 104-*b*.

The portions of the storage element material 365 positioned in the recesses may correspond to storage element components. In each recess, each storage element component of the storage element material 365 may contact a single conductive material 240 (e.g., a single conductive material 240 located adjacent to the cell of the storage element material 365) and at least two dielectric layers (e.g. a top insulative material 245 located on top of the storage element component of the storage element material 365 and a bottom insulative material 245 located on bottom of the storage element component of the storage element material 365). In some cases, each storage element component of the storage element material 365 may contact a single material 240. Here, the material 240 may subsequently (e.g., during a process step subsequent to what is illustrated in FIG. 3G) be removed and replaced by a conductive material. The etching of the storage element material 365 may expose the storage element components of the storage element material 365. The etching of the storage element material 365 may also expose the contacts 235 in the substrate 104-*b*.

FIG. 3H illustrates a section C-C' (illustrated in FIG. 3F) of the top view of an example memory array 200-*h* during a process step subsequent to what is illustrated in FIGS. 3E, 3F, and 3G. As shown in FIG. 3H, a conductive material 370 is deposited into openings 360. The conductive material 370 may form a conductive pillar extending from a first substrate (e.g., substrate 104-*a* as illustrated with reference to FIG. 2C) to a second substrate (e.g., substrate 104-*b*). In some implementations, the conductive material 370 contacts at least one portion of the layers of insulative material 245 and the storage element material 365 as shown in FIG. 3G. In some examples, the conductive material 370 is compatible with an active material. The conductive material 370 may be a uniform conductive material (e.g., a conformal conducive material), or a barrier layer with an internal material (e.g., where the barrier layer surrounds the conductive material).

In a case that the conductive material 370 includes a barrier layer and an internal material, a barrier material may be deposited into openings 360. In some implementations, the barrier material may contact at least one portion of the insulative material 245 and the storage element material 365 as shown in FIG. 3G. In some examples, the barrier material may be compatible with an active material. The barrier material may be a conductive material (e.g., a conformal conducive material), or a barrier layer with a conductive material. For example, the barrier material may comprise aluminum oxide. The internal material may be deposited in the opening 360 (e.g., to contact the barrier material) to form a conductive pillar. The internal material may be metallic (or semi-metallic) material or a semiconductor material such as a doped polysilicon material, among others. However, other metallic, semi-metallic, or semiconductor materials may be used. a metal material or a dielectric material.

The conductive material 370 may contact a first and second storage element component formed of storage element material 365. The pillar (e.g., of the conductive material 370) formed in each respective one of the set of openings 360 may be arranged to extend substantially orthogonal to the alternating planes of the material 240 and the insulative material 245. The storage element material 365 and the conductive pillar formed in each respective one of the set of openings 360 may be formed in a substantially square shape. Examples of the present disclosure are not limited to exact or quasi-exact square shapes. For instance, the storage element material 365 and the conductive pillar may be formed in any shape, including circles or oval shapes.

FIG. 3I illustrates an example memory array 200-*i* that support a vertical 3D memory device having an NMOS TFT selector in accordance with examples as disclosed herein. In the configuration of the memory device shown in FIG. 3I, a pillar of conductive material 370 contacts a contact 235 on a same substrate 104-*b*. The substrate 104-*b* is shown as positioned below the pillars of conductive material 370, but in some other cases, the contacts 235 may be formed through a substrate 104-*a* positioned above the pillar of conductive material 370.

The contact 235 may couple the pillar formed of conductive material 370 to an extra selection element such as a selection transistor. For example, the contact 235 may couple the pillar (e.g., digit line) to a NMOS TFT 305, which is formed in a pillar selection layer under the substrate 104-*b*. In some examples (not shown) the pillar selection layer may be above the memory layer, e.g., the TFT may contact from above the digit lines. A combination of the two configurations is also possible; e.g., some TFTs may be under the memory layer and some may be above the memory layer so that digit line selection may be partly from above and partly from below. The details of the NMOS TFT 305 will be described below. Portions above the pillar selection layer may form a memory layer where a vertical 3D memory array of memory cells is located. The transistor 305 may be a digit line selector formed in a regular matrix. The transistor 305 may be positioned to selectively couple or isolate the pillar (e.g., the digit line) at various times during access operations (e.g., a read operation, a write operation, a refresh operation). Activating the transistor 305 may initiate an access operation of one of the storage element components formed of storage element material 365. For example, activating transistor 305 and applying a voltage to material 240 (e.g., applying a voltage to a conductive material by a word line driver) may access storage element component formed of storage element material 365.

A peripheral circuit layer may be formed under the pillar selection layer, and in the peripheral circuit layer, for example, a sense amplifier and a decoding circuitry may be arranged for word lines and bit lines.

Figure 4A:
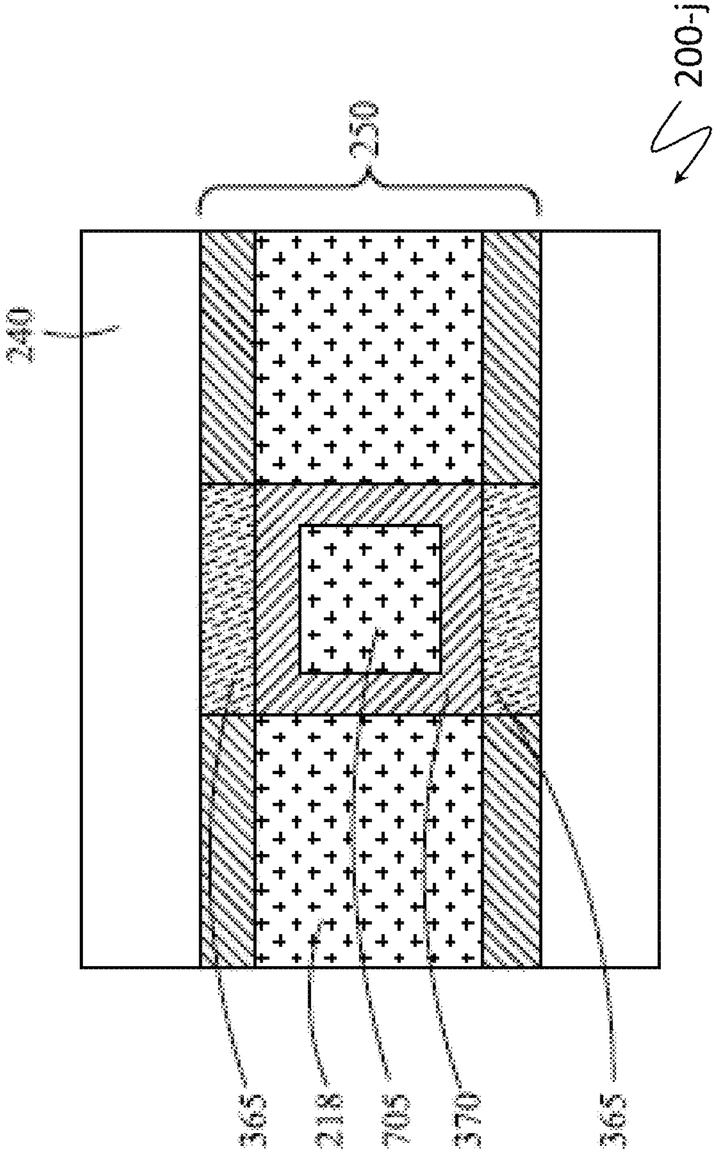
FIGS. 4A and 4B illustrate various views of further example memory arrays that support a vertical 3D memory device having an NMOS TFT selector in accordance with examples as disclosed herein.
Figure 4B:
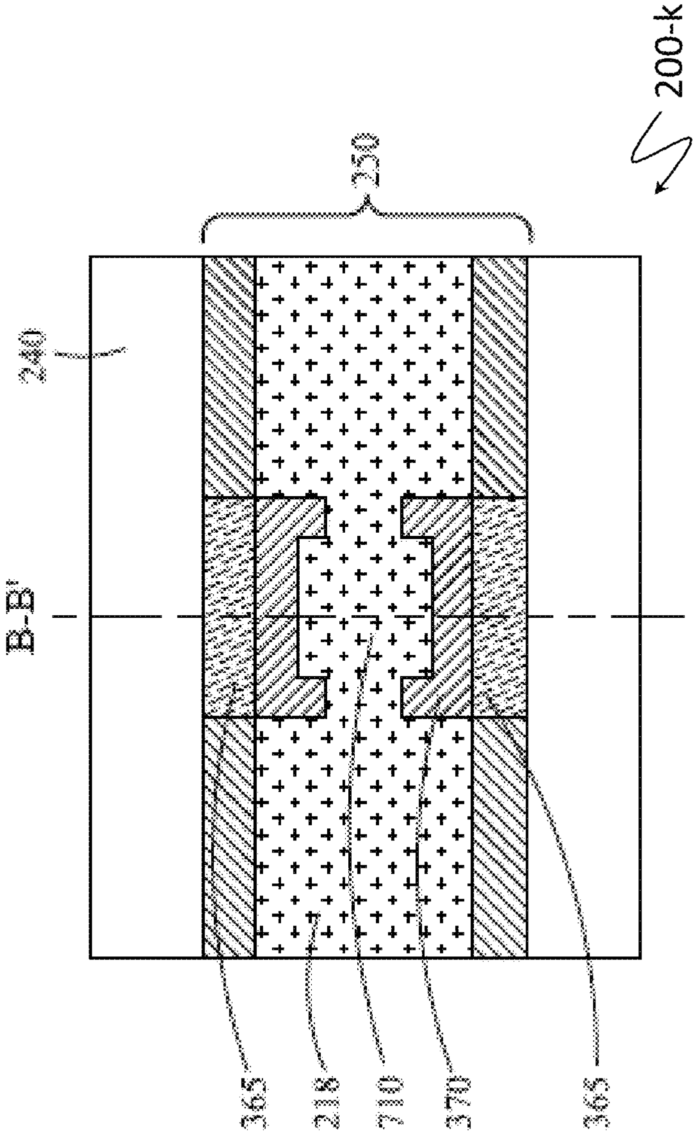

FIGS. 4A and 4B illustrate example memory arrays 200-*j* and 200-*k* during a series of steps or processes that may be performed to form a stacked memory device, in accordance with examples as disclosed herein.

FIG. 4A illustrates a top view of an example memory array 200-*j* in accordance with examples as disclosed herein. It may illustrate example memory array 200-*j* during a series of steps or processes that may be performed after FIG. 3G.

A conductive material 370 may be deposited into the opening 360 to form a conductive pillar. In some cases, the pillar may be partially filled by the conductive material 370 and subsequently filled by a dielectric material 705. In some cases, the dielectric material 705 may be the same as the dielectric material 218. The pillar may extend from a first substrate (e.g., substrate 104-*a*) to a second substrate (e.g., substrate 104-*b*).

The conductive material 370 may contact a first and second storage element component formed of storage element material 365. The pillar (e.g., of the conductive material 370 and the dielectric material 705) formed in each respective one of the set of openings 360 may be arranged to extend substantially orthogonal to the alternating planes of the material 240 and the insulative material 245.

FIG. 4B illustrates a top view of an example memory array 200-*k* in accordance with examples as disclosed herein. Memory array 200-*k* may be formed after forming a second opening and subsequently filling the second opening with the insulative material 710. In some cases, the dielectric material 705 and the insulative material 710 are examples of the same material. The second opening in trench 250 may be formed by etching away a portion of the conductive material 370. The etching process may further include etching away a portion of other materials. For example, the etching process may etch some (or all) of dielectric material 218. The etching process may include a vertical etching process that occurs substantially orthogonally to the alternating planes of the material 240 and the insulative material 245. For example, the etching process may include a single-gate vertical channel 3D not AND (SGVC) technique to create the second opening of example memory array 200-*k*. The second opening may extend to the bottom substrate (e.g., 104-*b*) to expose one or more contacts 235. The second opening may divide the pillar (e.g., comprising a conductive material 370 and dielectric material 705) into a pair of pillars including a first pillar (e.g., sub-pillar) and a second pillar (e.g., sub-pillar). Each sub-pillar of the pair of pillars may correspond to a digit line. A size (e.g., a cross-sectional area) of each sub-pillar of the pair of pillars may not affect an operation of the memory array 200-*k*. That is, a height of each sub-pillar of the pair of pillars (e.g., extending from a first substrate such as substrate 104-*a* to a second substrate such as a substrate 104-*b*) may be relatively low (e.g., less than two micrometers).

In some cases, the trench 250 may extend and include a set of second openings (e.g., separated by the dielectric material 218), where each opening divides pillars into pairs of pillars. The insulative material 710 may be a dielectric material. In some cases, the insulative material 710 may be a same material as dielectric material 218. The insulative material 710 may contact the pillars formed of the conductive material 370. The insulative material 710 may extend from a top substrate (e.g., substrate 104-*a* shown in FIG. 2A) to the bottom substrate (e.g., substrate 104-*b* shown in FIG. 2A) thus isolating each sub-pillar of a pair of pillars. The insulative material 710 may further extend to contact the insulative material 218. Here, an insulative material (e.g., the insulative material 410 in combination with the insulative material 218) may extend a length of the trench 250.

The insulative material 710 may isolate the pillars within a pillar pair from each other. This may decrease an effect of accessing a first storage element component on a second storage element component if the first and second storage element components are positioned in a same recess. The insulative material 710 may separate the storage element material 365 on either side of the trench 250. That is, the insulative material 710 may isolate (e.g., electrically) the memory cells (e.g., formed of the storage element material 365) contacting a first sidewall of the trench 250 from the memory cells contacting a second sidewall of the trench 250.

Figure 5:
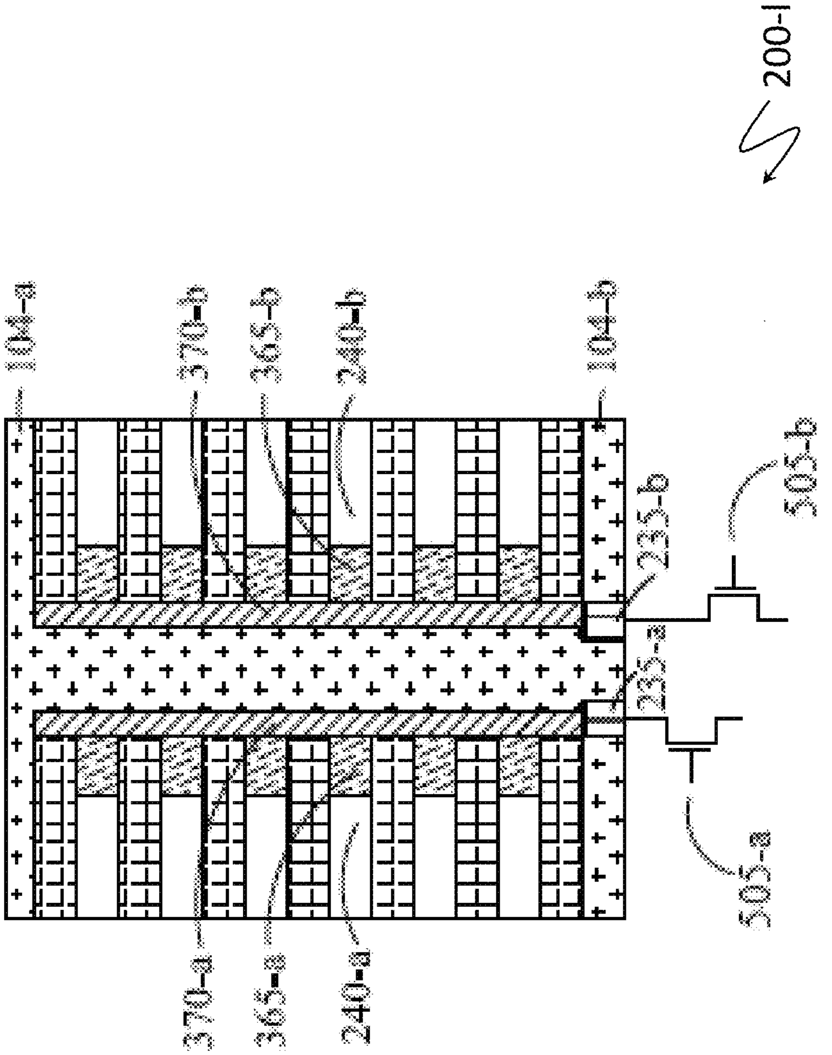
FIG. 5 illustrates a further example memory array that supports a vertical 3D memory device having an NMOS TFT selector in accordance with examples as disclosed herein.

FIG. 5 illustrates a further example memory array 200-1 that supports a vertical 3D memory device having an NMOS TFT selector in accordance with examples as disclosed herein. Specifically, FIG. 5 illustrates a configuration for coupling a digit line to a digit line selector.

FIG. 5 illustrates a cross-sectional view of a memory array 200-1. The cross-sectional view may be along section line B-B' as shown in any of FIG. 4B. FIG. 5 illustrates a configuration of a memory device where each pillar of conductive material 370 (e.g., of a pair of pillars) contacts a contact 235 on a same substrate 104. The substrate 104-*b* is shown as positioned below the pillars of conductive material 370, but in some other cases, the contacts 235 may be formed through a substrate 104-*a* positioned above the pillars of conductive material 370.

Memory array 200-1 may include a first pillar (or first sub-pillar) formed of conductive material 370-*a* in contact with contact 235-*a* of substrate 104-*b*. The contact 235-*a* may couple the pillar formed of conductive material 370-*a* to an extra selection element such as a selection transistor. For example, the contact 235-*a* may couple the first pillar (e.g., digit line) to a NMOS TFT 505-*a*, which is formed in a pillar selection layer (not shown in FIG. 5 and similar as shown in FIG. 3I) under the substrate 104-*b*. The details of the NMOS TFT 505-*a* will be described below. Portions above the pillar selection layer may form a memory layer (not shown in FIG. 5 and similar as shown in FIG. 3I) where a vertical 3D memory array of memory cells is located. The transistor 505-*a* may be a digit line selector formed in a regular matrix. The transistor 505-*a* may be positioned to selectively couple or isolate the pillar (e.g., the digit line) at various times during access operations (e.g., a read operation, a write operation, a refresh operation). Activating the transistor 505-*a* may initiate an access operation of one of the storage element components formed of storage element material 365. For example, activating transistor 505-*a* and applying a voltage to material 240-*a* (e.g., applying a voltage to a conductive material by a word line driver) may access storage element component formed of storage element material 365-*a*. The material 240-*a* may be an example of a conductive material 240. In some cases, the material 240-*a* may have been deposited onto a stack (e.g., during a process step illustrated prior to FIG. 2A) as a conductive material. In some other cases, the material 240-*a* may have been deposited onto the stack as a sacrificial insulative material. In a subsequent process step, the material 240-*a* may have been removed and replaced with a conductive material 240-*a*.

Memory array 200-1 may further include a second pillar (or second sub-pillar) formed of conductive material 370-*b* in contact with contact 235-*b* of substrate 104-*b*. The pillar formed of conductive material 370-*a* and the pillar formed of conductive material 370-*b* may be a pair of pillars. That is, the pillar formed of conductive material 370-*a* and the pillar formed of conductive material 370-*b* may be formed when a conductive pillar was divided by an etching process. The contact 235-*b* may couple the second pillar formed of conductive material 370-*b* to transistor (e.g., NMOS TFT) 505-*b*, which may be a digit line selector formed in a regular matrix. In some cases, the transistor 505-*b* may be at a same level (e.g., part of a same matrix) as the transistor 505-*a*. The details of the NMOS TFTs 505-*a* and 505-*b* will be described below.

In some embodiments, selector TFTs 505-*a* and 505-*b* may be on opposite sides of memory layer and contact respective sub-pillar from below (as depicted in FIG. 5) and from above (not shown); in some cases both TFTs may be in a pillar selection layer, e.g., a polysilicon layer, above the memory layer. A peripheral circuit layer, which is not shown in FIG. 5 and is similar as shown in FIG. 3I, may be formed under the pillar selection layer(s), and in the peripheral circuit layer, for example, a sense amplifier and a decoding circuitry may be arranged for word lines and bit lines.

Figure 6:
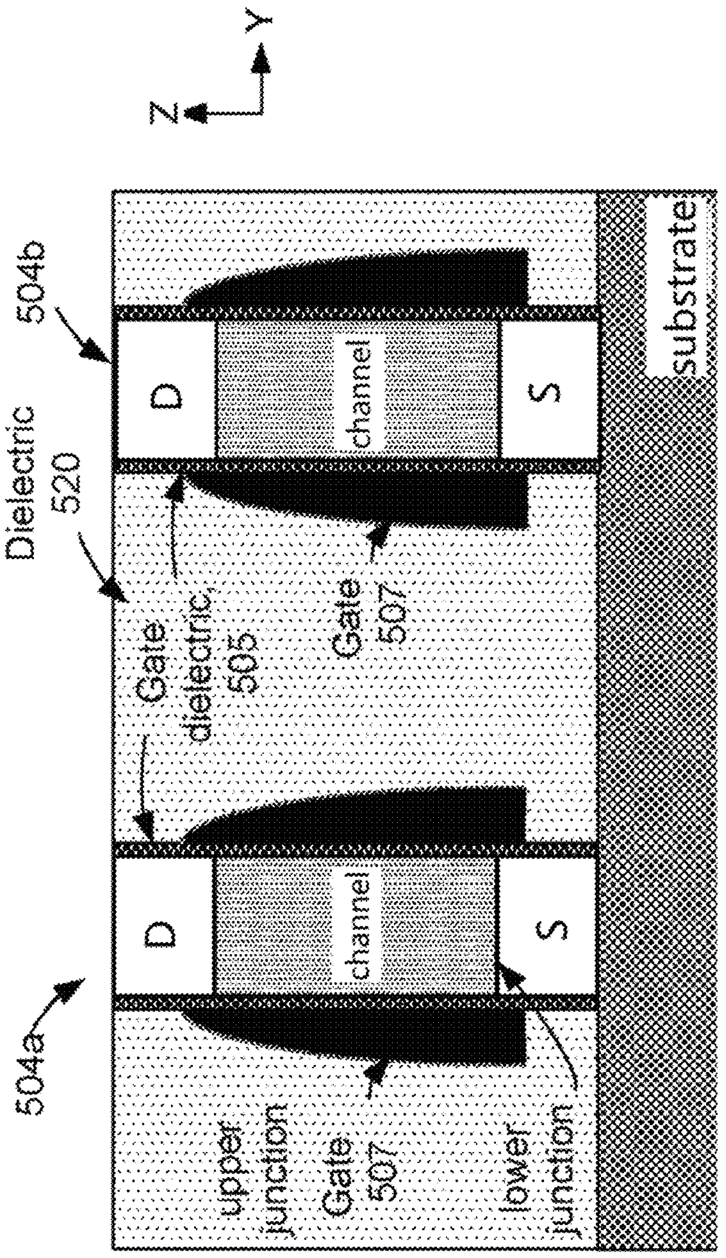
FIG. 6 illustrates an example NMOS TFT in accordance with examples as disclosed herein.

FIG. 6 illustrates an example of a transistor semiconductor device, for instance a field effect NMOS Thin Film Transistor (TFT) in accordance with examples as disclosed herein. FIG. 6 is a diagram of one embodiment depicting two TFT selection devices 504*a* and 504*b*, which may be used for selecting vertically oriented bit lines portions or array digit lines (not shown). Each TFT selection device 504*a*, 504*b* has two source/drain (S/D) regions. The source/drain regions are on either side of a channel region. The source/drain regions and channel region are polysilicon in one embodiment. The TFT select devices 504*a*, 504*b* has an upper junction between the channel region and upper D and a lower junction between the channel region and lower S.

Each of the TFT selection devices 504*a*, 504*b* has two gates 507 and a dielectric material 505 separating each gate from the channel region and S/D regions. This dielectric may be referred to as agate dielectric as it separates gates 507 from the channel region and S/D regions. In one embodiment, the gate dielectric 505 extends along the sides of the source/drain regions and the channel region or each selection device. The gate dielectric can be elongated in the x-direction along the vertical sidewalls of the pillar structure including the channel region and S/D regions.

The gate dielectric separates the gates from either the channel region or the source/drain regions, as the case may be. In this example, each gate 507 extends vertically from below the lower junction to above the upper junction. That is, the gates 507 are formed directly adjacent to the vertical extent of the channel region and directly adjacent to a portion of the vertical extent of both S/D regions. The upper drain may be connected to a vertically oriented bit line portion or array digit line. In some embodiments, gates 507 may be formed depositing a gate material and selectively, e.g., anisotropically, removing it, for example forming spacer-like structures of the gate material adjacent to the gate dielectric, along and/or around the channel regions, for example.

A gap fill dielectric 520 such as an oxide is formed between adjacent selection devices as an insulating material. In some cases, the TFT selection device 504*a* and 504*b* may share a same gate 507 therebetween. In other words, there may be no gap between adjacent selection devices 504*a* and 504*b*.

In some cases, the TFT selection devices may be formed in a regular matrix under the memory array, in particular under pillars of memory cells. In this example, a pitch of adjacent TFT selection devices in x-direction may be in line with a corresponding pitch of memory cells, which will be further explained with reference to FIGS. 7A-7C.

Figure 7A:
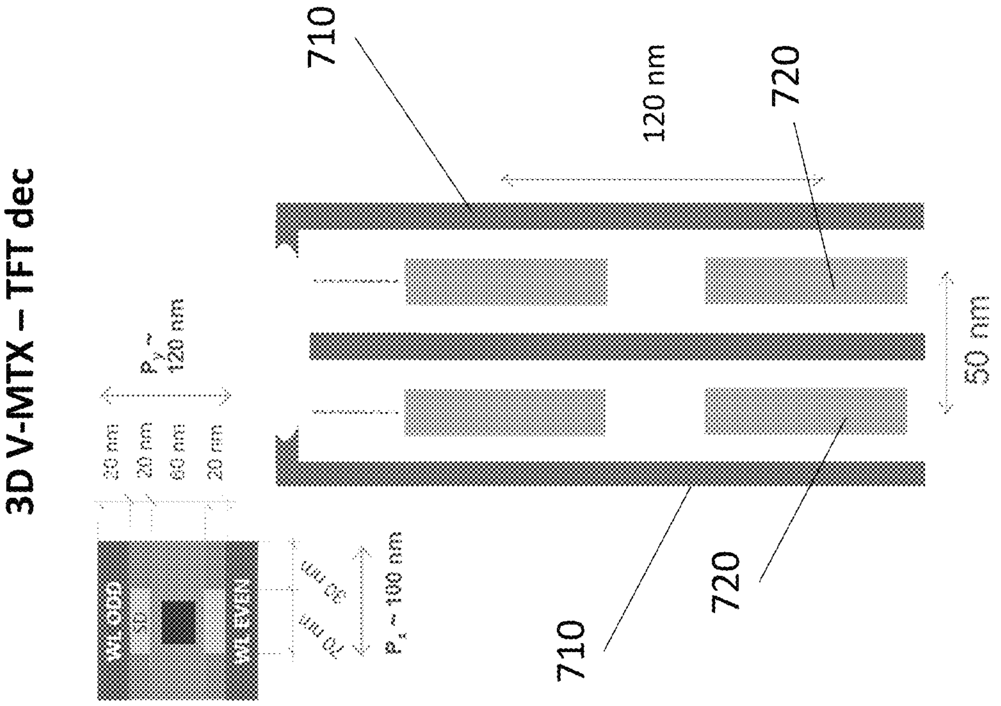
FIGS. 7A through 7C illustrate various views of example NMOS TFT selectors in accordance with examples as disclosed herein.
Figure 7B:
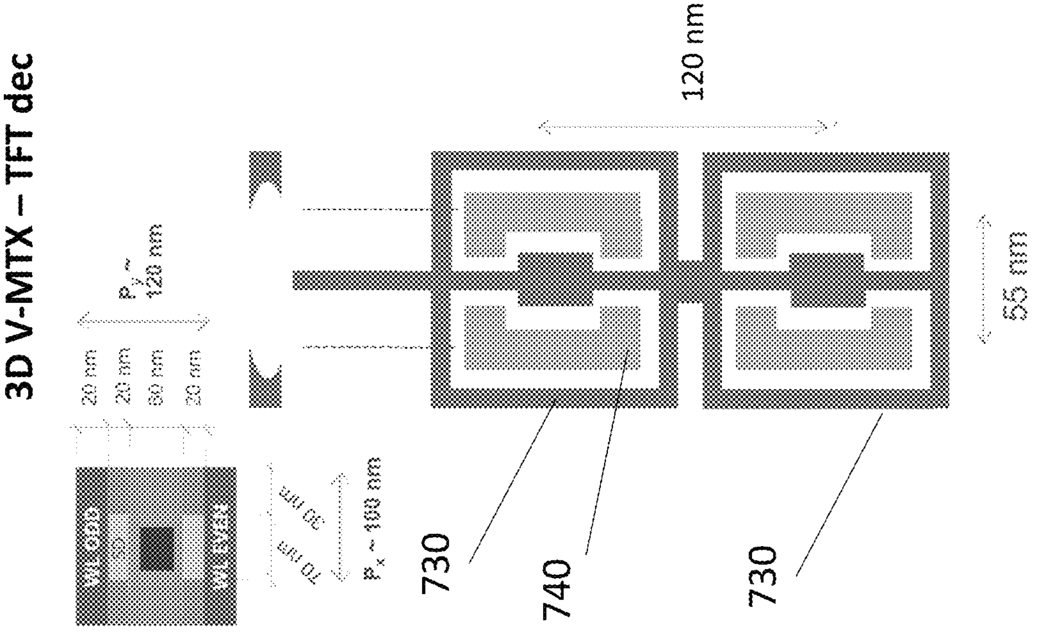
Figure 7C:
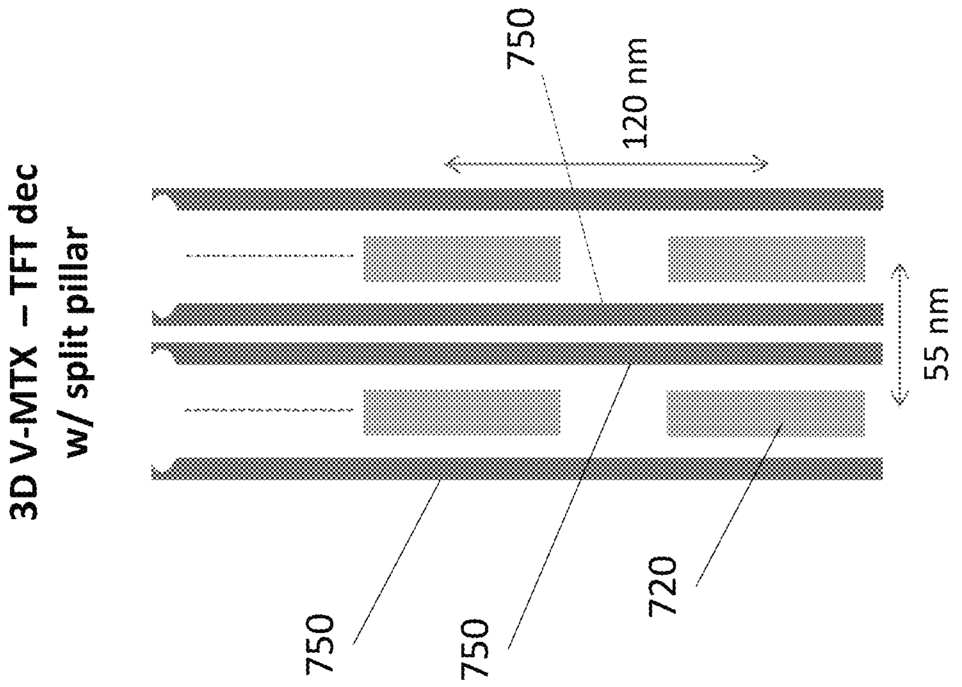

FIGS. 7A-7C illustrate various views of example NMOS TFT selectors in accordance with examples as disclosed herein.

Conventionally, a poly-Si based TFT having for instance a 48 nm pitch and a channel length 100 nm may be capable to support 1.5V as max drain bias and 3.5 V as max gate bias, which may have an $I_{ON}$ of 20 uA. Other voltage and/or current values are possible. This is an always depleted MOSFET with N+S/D implants and N− channel implant. However, in the present disclosure, coherently with the pronounced relaxed pitch of the V-3D MTX cell, a selector transistor configured with at least a couple of elongated TFTs in parallel enabling more than a factor 10× of the $I_{ON}$ is proposed. This 10× factor will become a 5× factor or more as a consequence of the channel length doubling (from 110 to ~220 nm).

As shown in FIGS. 7A-7C, the strips 710 may represent the gate terminals. There may be two gates with gate oxide at one side and another gate oxide at the other side of a channel region 720, which may be represented by a rectangle box, and thus a width of the TFT may be doubled. Under the rectangle box 720, there may be a source region of the TFT, and the rectangle box may correspond physically to a polysilicon pillar of the transistor channel while the drain region is connected to the pillar.

In other words, a matrix of thin film transistors (TFTs) is provided under the digit lines with one TFT transistor for each digit line. The thin film transistors (TFTs) are formed in a polysilicon layer under the 3D memory array while the peripheral circuitry is formed under said matrix with sense amplifiers and decoding circuitry for word lines and bit lines.

As can be seen from these FIG. 7A, the transistor channel has been extended up to 120 nm with an integrate distance limited to 50 nm. Accordingly, the width of the transistor has been relaxed or expanded and two transistors have been arranged in parallel so that the driving capability may be about five times (because of the larger width) thus capable to feed a right current to the memory cells.

FIG. 7B shows schematically an alternative configuration wherein strips 730 of gate terminals are formed surrounding the channel region 740 in a squared configuration.

As a further alternative, in FIG. 7C it is shown an example wherein strips 750 are doubled between two adjacent channel regions 720 while keeping the integrate distance still reduced at 55 nm.

FIGS. 8A-8D illustrate various diagrams for accessing a memory cell of a vertical 3D memory device having an NMOS TFT selector in accordance with examples as disclosed herein. Specifically, FIGS. 8A-8D show how it is possible to select a single memory cell with a single NMOS TFT while de-selecting all the others.

These figures may show just as an example a 3×3 matrix of pillars (P1, . . . , P9—i.e. the pillars are extended vertically toward the reader), and more particularly, a little matrix of the nine TFT selection transistors is provided at the bottom of these pillars, one TFT for each pillar.

Figure 8A:
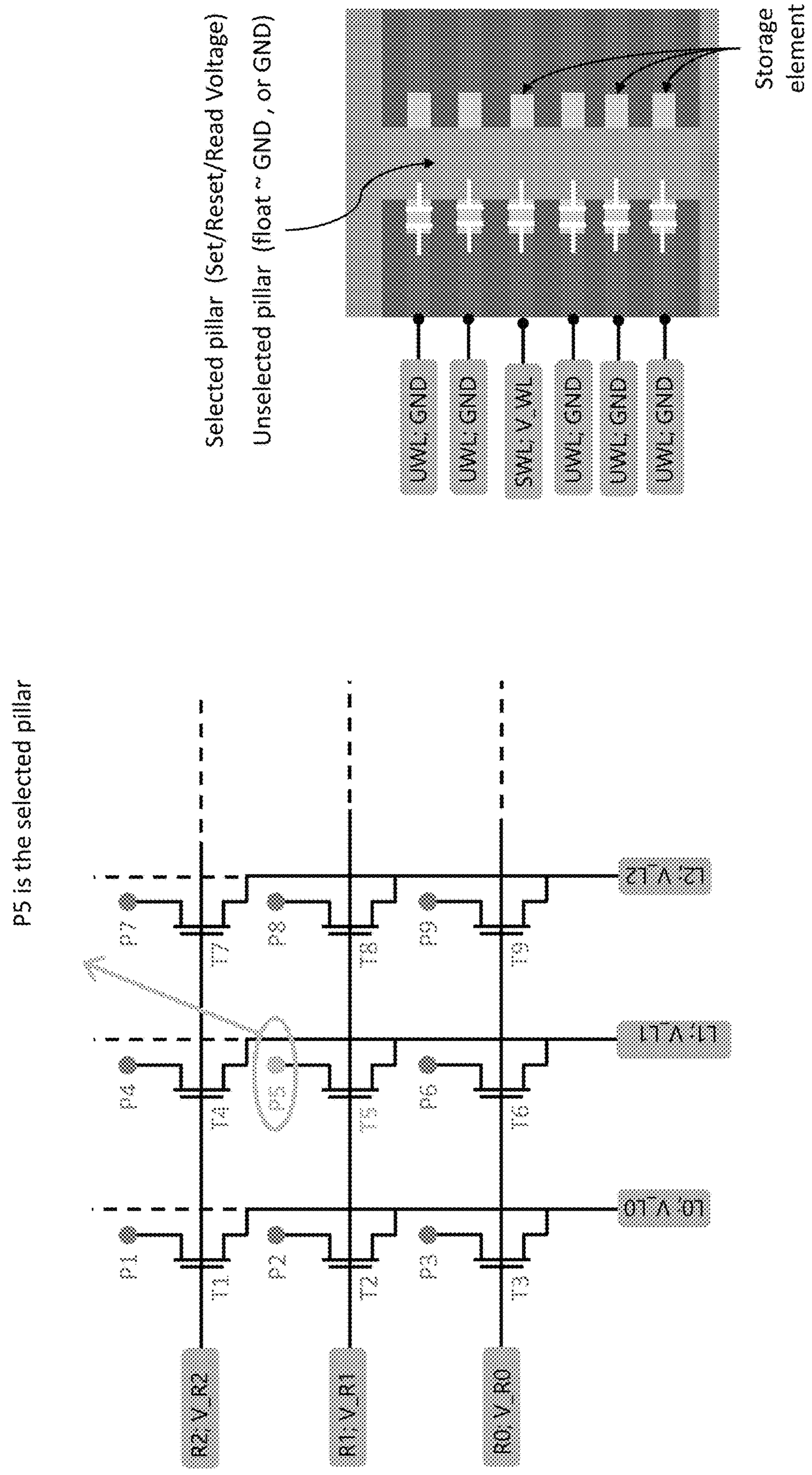
FIGS. 8A through 8D illustrate various diagrams for accessing a memory cell of a vertical 3D memory device having an NMOS TFT selector in accordance with examples as disclosed herein.

As shown in FIG. 8A, a floating-bias strategy for unselected pillars that cannot be shorted to GND is safely adopted for de-selection. The potentials of un-selected pillars remaining floating will be dictated by the capacitive ratio between pillar and WLs (biased at GND—all the unselected—and at −3.5V—the selected one), thus being about at GND.

On the left side of FIG. 8A, the example 3×3 matrix of pillars (P1, . . . , P9) is represented. Each pillar may correspond to digit line 115 in FIG. 1 and may comprise conductive material 370, as described above, in some examples. Each pillar (P1, . . . , P9) is coupled to a respective selecting transistor (T1, . . . , T9), that may correspond to pillar selector transistor 305, 505-*a*, 505-*b* and may be a NMOS Thin Film Transistor (TFT), in some examples. Transistors (T1, . . . , T9) may be formed in a pillar selection layer under a memory layer; a peripheral circuit layer may be formed under the pillar selection layer. Selector transistors (T1, . . . , T9) may be formed as described with reference to FIGS. 6 and 7 above.

Pillars (P1, . . . , P9) and selector transistors (T1, . . . , T9) may be organized in rows and columns as depicted in FIG. 8A. For example, transistors T1, T2 and T3 may have respective terminals, e.g., source terminals, coupled to a common line L0; transistors T4, T5 and T6 may have respective terminals, e.g., source terminals, coupled to a common line L1 and transistors T7, T8 and T9 may have respective terminals, e.g., source terminals, coupled to a common line L3. Lines L0, L1 and L2 may be coupled (not shown) to digit line driver formed in a peripheral circuit layer formed under the pillar selection layer, e.g., in a silicon substrate layer, such as a CMOS under array. Lines L0, L1 and L2 are configured to be biased to respective line voltages V_L0, V_L1 and V_L2, that may be a selected digit line programming (e.g., Set/Reset) or reading voltage or unselected digit line voltage(s).

In the depicted rows/columns organization, transistors T1, T4 and T7 may have respective gate terminals coupled to a common row line R2; transistors T2, T5 and T8 may have respective gate terminals coupled to a common row line R1 and transistors T3, T6 and T9 may have respective gate terminals coupled to a common row line R0. Lines R0, R1 and R2 may be coupled (not shown) to digit line driver control circuitry formed in the peripheral circuit layer. Row lines R0, R1 and R2 are configured to be biased to respective row line voltages V_R0, V_R1 and V_R2, that may be a passing voltage or to an inhibit voltage, based on the operation to be performed and the addresses cell or pillar.

On the right side of FIG. 8A, a schematic section of a portion of a 3D memory array, is represented. Each memory cell comprises a storage element the crossing of a digit line, e.g., pillar P1, and a word line that may be a selected word line SWL or an unselected word line UWL. Memory cells may be programmed in one of at least two states by applying a programming pulse of appropriate amplitude and polarity. For example, a memory cell may be programmed in a first state, a Set state, applying a first polarity pulse with magnitude higher than a threshold voltage of the memory cell; the first polarity may be a positive polarity, e.g., word line voltage higher than digit line voltage—see discussion referring to FIG. 8B. A memory cell may be programmed in a second state, a Reset state, applying a second polarity pulse with magnitude higher than a threshold voltage of the memory cell; the second polarity may be different than, e.g., opposite to, the first polarity, so the second polarity may be a negative polarity, e.g., word line voltage smaller than digit line voltage—see discussion referring to FIG. 8C. Programming polarities may be interchanged in some embodiments; for example, the Set state may be programmed with a negative polarity and the Reset state may be programmed with a positive polarity in some cases. Set and Reset states may correspond to a logic 1 and a logic 0 state, respectively; however, a different convention may be adopted.

Memory cells in different states (e.g., Set and Reset, or logic 1 and 0) have different threshold voltages. Accordingly, it is possible to read the cell state applying a sensing or reading voltage across the memory cell. The reading voltage may be a positive voltage or a negative voltage; depending on the polarity of the reading voltage different situations may occur, as explained in the following.

Generally speaking, after a programming pulse in a given polarity, the memory cell has a low threshold voltage when reading is carried out in the same polarity, while it has a high threshold voltage when read in the opposite polarity. Accordingly, if a Set state is programmed with a positive polarity pulse, as described above, it has a low threshold voltage when read in the same (positive) polarity. On the contrary, the cell programmed in the Set state with a positive polarity pulse has a high threshold voltage when read in the opposite (negative) polarity. At the same time, if a Reset state is programmed with a negative polarity pulse, as described above, it has a high threshold voltage when read in the opposite (positive) polarity. On the contrary, the cell programmed in the Reset state with a negative polarity pulse has a low threshold voltage when read in the same (negative) polarity.

Independently of the reading polarity, it is possible to discriminate between the Set and the Reset state and therefore read the cell logic state associated thereto. Indeed, it is sufficient to bias the selected digit line terminal and selected word line SWL terminal to a reading voltage that is intermediate between the low threshold voltage and the high threshold voltage of the memory cells and detect which memory cells drain a high current or have thresholded. In the example above, adopting a negative polarity reading scheme, the cell programmed in the Set state with a positive polarity pulse does not threshold, while the cell programmed in the Reset state with a negative polarity does threshold. As already mentioned, a different reading scheme may be adopted, for example a positive polarity reading scheme.

Referring again to the cross section shown in the right side of FIG. 8A, during an access operation, in case the pillar is the selected pillar (e.g., pillar P5 in the left portion of FIG. 8A), the pillar is biased to an addressed digit line access voltage, that may be a programming voltage (e.g., a Set or a Reset voltage), or to a read voltage, based on the operation being carried out. All cells coupled to the selected pillar have the digit line terminal biased to the digit line access voltage, but only the addressed cell (the one on the fourth plane from the bottom, in the depicted example) has the word line terminal SWL biased to the word line access voltage VWL—all other cells, e.g., unselected cells in the selected pillar have the unselected word line UWL terminal biased to an unselect voltage, for example a ground (GND) voltage.

During an access operation, in case the pillar is an unselected pillar (e.g., pillars P1, . . . , P4, P6, . . . , P9) the pillar is floating (or grounded) because, as it will be explained in detail below, the corresponding selector transistor (T1, . . . , T4, T6, . . . , T9) is in a inhibiting condition and therefore effectively insulates the pillar from the biasing circuitry (or it is passing an inhibiting voltage, e.g., a ground voltage GND, provided by the biasing circuitry). When the unselected pillar is floating, it is capacitatively coupled to the word lines, so the actual pillar voltage depends on the word lines voltages weighted by the respective capacitive ratio (pillar capacitance with respect to each WL node divided by the total capacitance, e.g., the pillar capacitance with respect to all the WL nodes). Since all unaddressed or unselected word lines UWL are at ground voltage during the access operation and only the addressed or selected word line SWL is at the access voltage, the pillar voltage remains close to ground. Deviation from ground voltage decreases with increasing number of word lines, e.g., with increasing number of planes or decks in the 3D memory array.

Despite a small matrix of pillars (P1, . . . , P9) and selector transistors (T1, . . . , T9) organized in 3 rows and 3 columns is shown in FIG. 8A, any number of rows and columns may be used. In the description below, pillar P5 will be considered as the addressed, or target, pillar, e.g., the addressed cell is coupled to selected pillar P5 and to the selected plane or word line SWL. Based on the desired operation, the selected word line SWL is biased to an access word line voltage V_WL that typically is of opposite polarity with respect to the digit line access voltage; in an exactly split voltage approach the digit line voltage and the word line voltage have the same, or approximatively the same; however, different approaches may be adopted, such as an amplitude ratio different than 1, for example Even if not explicitly specified, unaddressed word lines UWL are normally biased to a ground voltage by corresponding word line circuitry (not shown).

In order to simplify the description below, a negative voltage reading scheme will be adopted; e.g., during a read access operation the overall voltage drop across the memory cell's selected word line SWL terminal and the selected digit line terminal (pillar P5) is negative, that is V_WL−V_L1<0 volts. Moreover, it will be assumed that threshold voltage of memory cells in a Set state (e.g., a logic 1 state) is in negative voltage range from about −6.5V to about −5.5V (corresponding to a positive voltage reading range from about +3.5V to about +4.5V), while threshold voltage of memory cells in a Reset state (e.g. a logic 0 state) is in negative voltage range from about −4.5V to about −3.5V (corresponding to a positive voltage reading range from about +5.5V to about +6.5V). This is just an example and different threshold voltage values and ranges may be used. Accordingly, in the example above, during an access operation to read a memory cell a −5.0V reading voltage may be applied across the addressed memory cell (e.g., selected word line SWL voltage vs. selected digit line P5 voltage), as described in FIG. 8D.

Figure 8B:
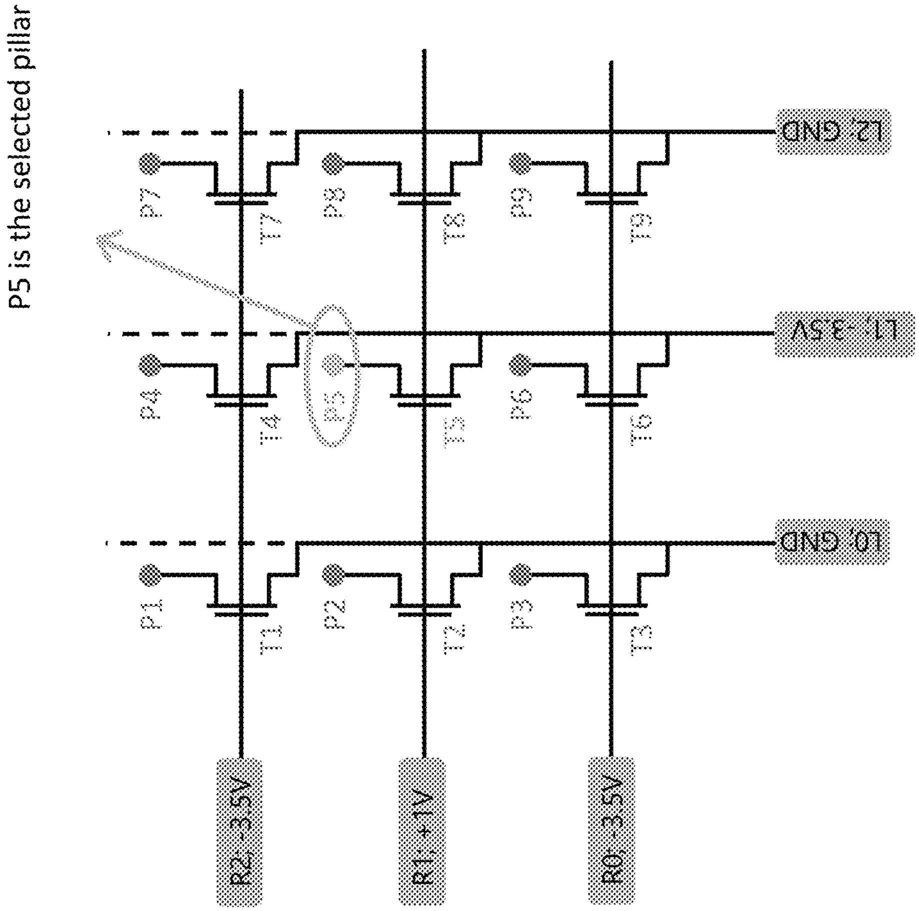

As shown in FIG. 8B, a memory cell connected to the P5 pillar may be programmed in the SET state. For this purpose, a positive bias pulse around +7 V may be required to be applied, since the cell could be in the Reset state with a threshold voltage Vt high up to 7 V (considering a 0.5V margin with respect to the target Reset programmed state threshold voltage range of 5.5-6.5V). This can be obtained by applying up to at least +3.5V to the selected word line (while the others are at GND—not shown here, see FIG. 8A) and applying up to at least −3.5V to the bit line L1. The voltage is transferred to the digit line of the addressed cell in the array (pillar P5) by enabling sector transistor T5 with a gate pass voltage of +1.0V, for example, applied to row line R1. Other pillars (P1, . . . , P9, apart P5), which cells can potentially share the same word line and/or bit line, need to be deselected.

With increasing voltage of the row lines R0 and R2 and gates coupled thereto at a bias higher than −3.5V, transistors T4 and T6 would switch on therefore undesirably biasing array digit lines, e.g., pillars P4 and P6, coupled to the addressed bit line L1. Accordingly, −3.5V blocking or inhibiting bias may be imposed to row lines R0 and R2 to avoid the switching-on of T4 and T6; this results in effectively floating array digit lines P4 and P6. Then, a ground voltage GND may be applied to bit lines L0 and L2.

In this configuration, all the TFTs T1, . . . , T9 (apart T5) may be in an off state, e.g., the voltage at the respective terminal coupled to bit lines L0, L1 and L2 is not transferred to respective pillars P1, . . . , P9 (apart P5) that therefore may result in floating. Transistors T2 and T8 may or may not transfer the GND voltage to respective pillars P2 and P8, based on their actual threshold voltage and actual biasing voltage of row line R1 (that may be adjusted accordingly).

The floating pillar potentials will be dictated by the capacitive ratio between pillar and WLs (all the unselected word lines biased at GND and the selected WL biased at +3.5V). So, floating pillars may reach a slight positive bias (e.g., +1V), that is safe for de-selection.

Figure 8C:
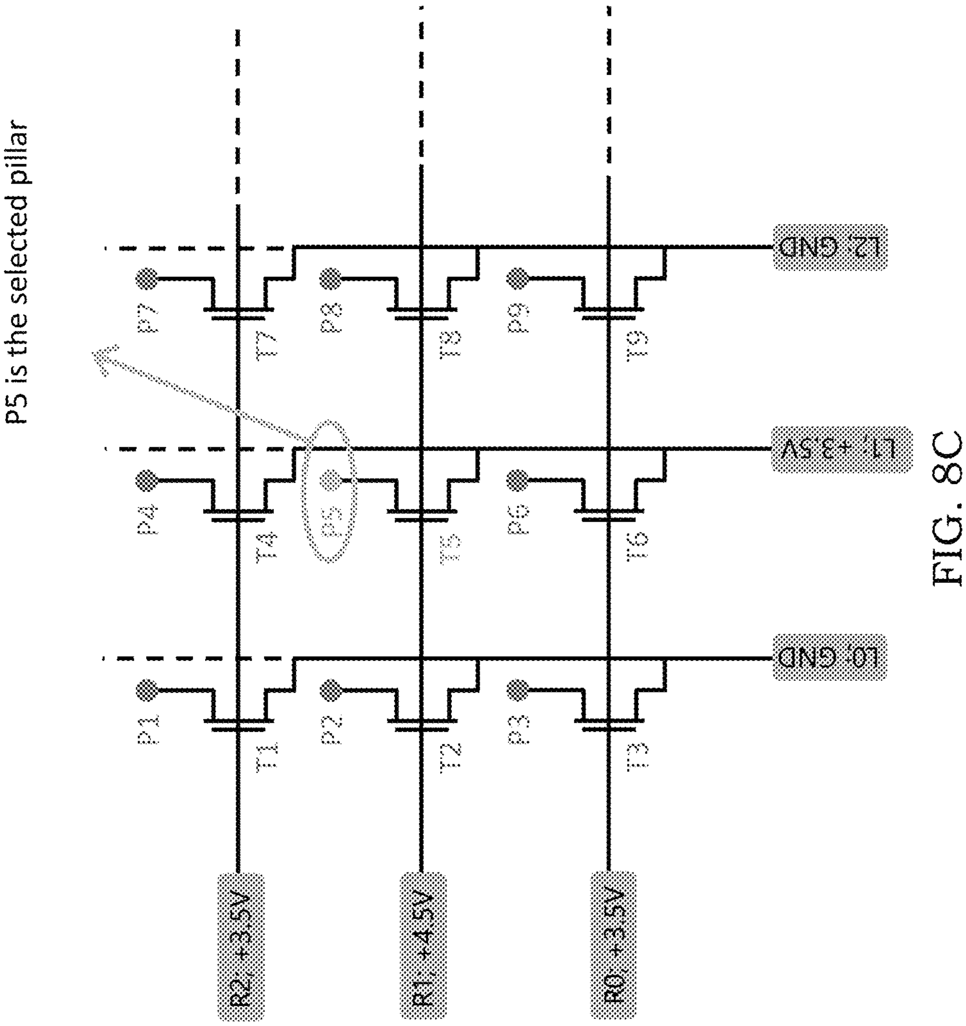

As shown in FIG. 8C, a memory cell connected to the P5 pillar may be programmed in the RESET state. For this purpose, a negative bias pulse around −7 V may be required to be applied, since also cells in the Reset state need to be re-programmed and/or the cell could be in the Set state with a threshold voltage Vt high up to −7 V (considering a 0.5V margin with respect to the target Set programmed state threshold voltage range of −5.5 to −6.5V). This can be obtained by applying −3.5V to the selected word line (while the others are at GND—not shown here, see FIG. 8A) and applying +3.5V to the bit line L1. The voltage is transferred to the digit line of the addressed cell in the array (pillar P5) by enabling sector transistor T5 with a gate pass voltage of +4.5V, for example, applied to row line R1. Other pillars (P1, . . . , P9, apart P5), which cells can potentially share the sameword line and/or bit line, need to be deselected.

To switch-off transistors T4 and T6, and therefore effectively insulate pillars P4 and P6 from bit line L1, row lines R0 and R2 and gates coupled thereto can be biased at +3.5V, so that P4 and P6 pillars will be floating. Then, a ground voltage GND may be applied to bit lines L0 and L2, so that array digit line pillars P1, P2, P3, P7, P8 and P9 will be shorted at GND through respective transistors T1, T2, T3, T7, T8 and T9.

In this configuration, only pillars P4 and P6 may result in floating. The potentials of digit line P4 and P6 pillars will be dictated by the capacitive ratio between pillar and WLs (all the unselected word lines biased at GND and the selected one biased at −3.5V). So, floating pillars may reach a slight negative bias (e.g., −1V), that is safe for de-selection. Other unaddressed pillars are grounded, that is also a safe condition for de-selection.

Figure 8D:
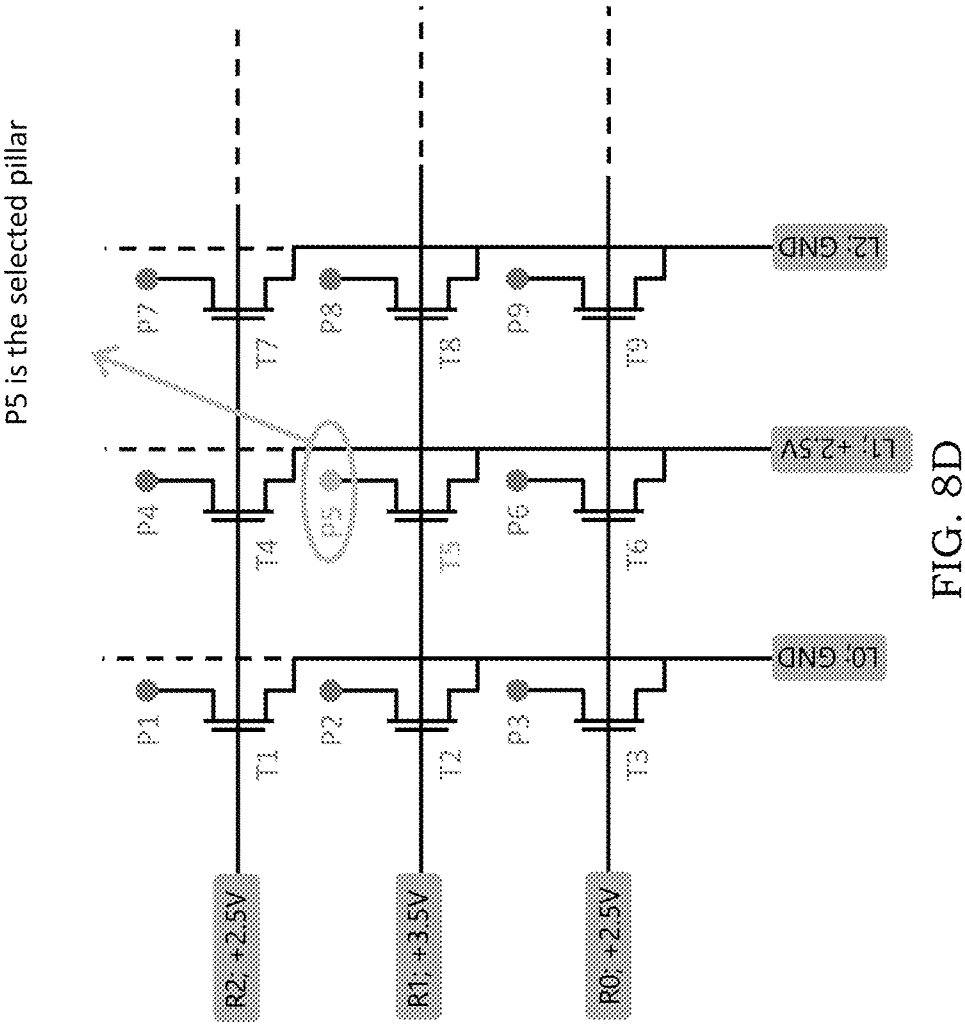

As shown in FIG. 8D, a state of a memory cell connected to the P5 pillar may be read out. For this purpose, a negative bias pulse around −5 V may be required to be applied. This can be obtained by applying up to at least −2.5V to the selected word line (while the others are at GND—not shown here, see FIG. 8A) and applying up to at least +2.5V to the bit line L1. The voltage is transferred to the digit line of the addressed cell in the array (pillar P5) by enabling sector transistor T5 with a gate pass voltage of +3.5V, for example, applied to row line R1. Other pillars (P1, . . . , P9, apart P5), which cells can potentially share the same word line and/or bit line, need to be deselected.

To switch-off transistors T4 and T6, and therefore effectively insulate pillars P4 and P6 from bit line L1, row lines R0 and R2 and gates coupled thereto can be biased at +2.5V, so that P4 and P6 pillars will be floating. Then, a ground voltage GND may be applied to bit lines L0 and L2, so that array digit line pillars P1, P2, P3, P7, P8 and P9 will be shorted at GND through respective transistors T1, T2, T3, T7, T8 and T9.

In this configuration, only pillars P4 and P6 may result in floating. The potentials of digit line P4 and P6 pillars will be dictated by the capacitive ratio between pillar and WLs (all the unselected word lines biased at GND and the selected one biased at −2.5V). So, floating pillars may reach a slight negative bias (e.g., −0.5V), and that is safe for de-selection. Other unaddressed pillars are grounded, that is also a safe condition for de-selection.

If a positive polarity read scheme is adopted (not represented in any drawing), similar biasing conditions may be applied as those described with reference to programming a memory cell to a Set state depicted in FIG. 8B, but with smaller amplitude for word line and bit line pulses to avoid thresholding of all cells and rather induce snap-back only on Set cells. For example, a positive word line reading voltage V_WL of +2.5V may be applied to the selected word line SWL, a negative bit line reading voltage of −2.5V may be applied to the selected bit line L1, a passing voltage of +1.0V may be applied to the gate terminal of select transistor T5 coupled to the addressed digit line P5 through row line R1; the biasing conditions described above are suited to apply to the addressed cell a reading voltage of +5.0V. Different amplitudes may be used. Additionally, unaddressed or unselected bit lines L0 and L2 may be biased at a ground voltage and unaddressed or unselected word lines R0 and R2 may be biased to a blocking or inhibiting voltage of, for example, −2.5V, resulting in all unaddressed or unselected digit lines to float.

The voltage values used in the description above are just example values and may be varied maintaining the scope of the invention. In some cases, the ground voltage (GND) may differ from 0V; for example, it may be a positive or a negative voltage with respect to which other positive or negative voltages are evaluated. The same concepts and solutions described above may also apply to array configurations that differ from the 3D memory device configuration depicted with reference to FIGS. 8A-8D; for example, a 3D sub-pillars in a memory array similar to the one described with reference to FIGS. 4-7 may be addressed with the necessary minor adaptations. In some cases, shared bit lines may drive gates of selector transistors (for example TFT transistors) as depicted in FIGS. 7A and 7B for a split pillar architecture where even/odd cells are selected by even/odd word lines at each deck or plane; alternatively, even/odd sub-bit lines may independently drive gates of selector transistors as depicted in FIG. 7C. Other pillar or sub-pillar decoding arrangements (e.g., different from the bit line L0-L2/row line R0-R2 depicted in FIG. 8) for selector transistors may also be implemented.

It should be further noted that (not explicitly depicted in any drawing) the selector transistors, e.g., the pillar section layer may be formed, at least partially, on top of the memory layer—see in FIG. 3I for better identification of the mentioned layers. For example, TFTs may be formed in part (e.g., coupled to even bit lines/sub-pillars) below the memory array (e.g., below the word lines conductive material layers) and in part (e.g., coupled to odd bit lines/sub-pillars) above the memory array. Additionally or alternatively, a plurality of building blocks each comprising a memory layer and corresponding pillar selection layer may be arranged on top of each other in a building block stack. These arrangements would allow to replicate a same basic building block (e.g., including a given number of memory decks or layers and the corresponding pillar selection) several times during manufacturing to obtain 3D memory arrays with increased height (e.g., taller, with more decks and layers) and therefore increased superficial density. Bit lines for the different blocks and/or row lines for decoding the corresponding TFT selector transistors may be shared by all the vertically stacked blocks (in which case word lines are separately decoded) or they may be separate for each stacked block (in which case word lines may be commonly or individually decoded). Connections to bit lines, row lines and/or word lines may extend from the peripheral circuit layer in a substrate (such as a silicon substrate accommodating CMOS Under the Array—CUA—circuitry, for example decoding and sensing circuitry) to the corresponding building block vertically running adjacent to the memory array.

Figure 9:
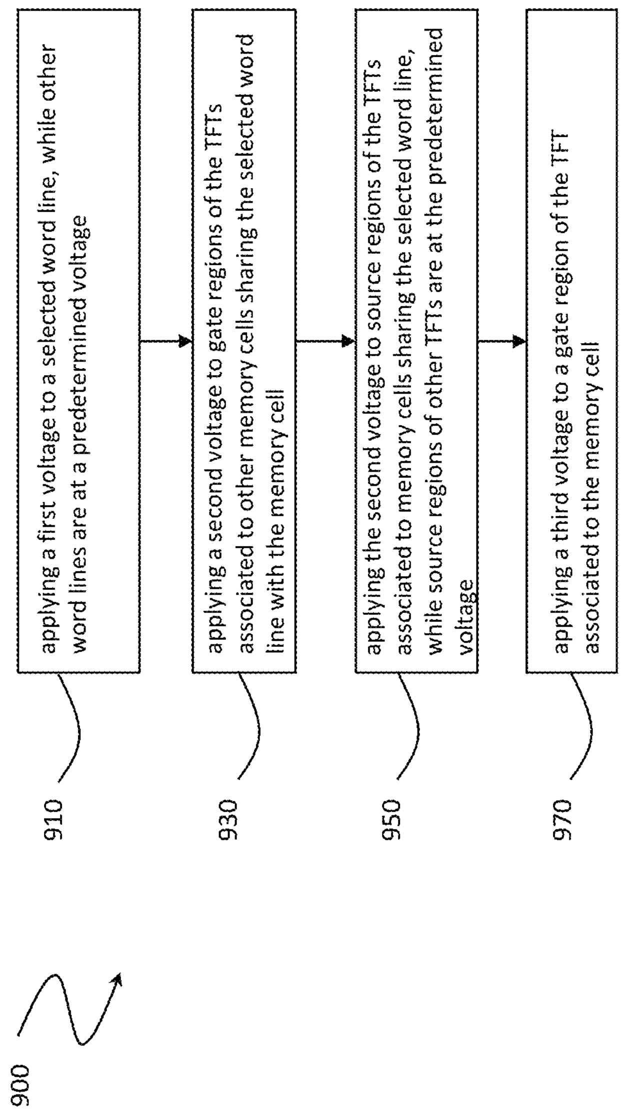
FIG. 9 shows a flowchart illustrating a method for accessing the vertical 3D memory device with having an NMOS TFT selector in accordance with examples as disclosed herein.

FIG. 9 shows a flowchart illustrating a method for accessing a memory cell in a vertical 3D memory device having an NMOS TFT selector in accordance with examples as disclosed herein. The operations of method 900 may be implemented by one or more controllers associated with the memory device. In some examples, one or more controllers may execute a set of instructions to control one or more functional elements of the memory device to perform the described functions. Additionally or alternatively, one or more controllers may perform portions of the described functions using special-purpose hardware.

At 910, the method 900 may include applying a first voltage to a selected word line, while other word lines are at a predetermined voltage. The operations of 910 may be performed according to the methods described herein.

At 930, the method 900 may include applying a second voltage to gate regions of the TFTs associated to other memory cells sharing the selected word line with the memory cell. The operations of 930 may be performed according to the methods described herein.

At 950, the method 900 may include applying the second voltage to source regions of the TFTs associated to memory cells sharing the selected word line, while source regions of other TFTs are at the predetermined voltage. The operations of 950 may be performed according to the methods described herein.

At 970, the method 900 may include applying a third voltage to a gate region of the TFT associated to the memory cell. The operations of 970 may be performed according to the methods described herein.

In some cases, according to the technology used, the first voltage may be +3.5V, the second voltage may be −3.5V, the third voltage may be +1V, and the predetermined voltage may be a ground voltage.

In some cases, according to the technology used, the first voltage may be +2.5V, the second voltage may be −2.5V, the third voltage may be +1V, and the predetermined voltage may be a ground voltage.

In some cases, the first voltage may be −3.5V, the second voltage may be +3.5V, the third voltage may be +4.5V, and the predetermined voltage may be a ground voltage.

In some cases, the first voltage may be −2.5V, the second voltage may be +2.5V, the third voltage may be +3.5V, and the predetermined voltage may be a ground voltage.

It should be noted that in the accessing made with a single NMOS TFT, for the non-selected pillars receiving the 3.5 V, the transistor channel may be choked, and no current may pass, and thus the source region may not even need to be put at GND. The corresponding NMOS TFT may remain floating. The pillars of the floating NMOS selection transistors might be dangerous for the correct reading of the memory device. However, when the target cell is being programmed, only the plate or plane of the selected word line is biased to 3.5 V (as shown in FIG. 8A). Therefore, because of the capacitive coupling of all the other plates or planes that are biased to ground, even the floating pillar is taken to a voltage that is close to ground and it does not affect the functioning of the memory device.

The accessing scheme provided in the present disclosure may further show that at least some of the pillars close to the selected pillar remain to biasing voltage close to ground and are not affected by the activities performed on the selected pillar.

It is disclosed a method for de-selecting an unaddressed memory cell in a 3D memory array with a plurality of word lines extending in a horizontal direction on a plurality of decks and a plurality of array digit lines extending in a vertical direction, each memory cell at the crossing of one word line and one array digit line, comprising floating an array digit line of the plurality of array digit lines coupled to the unaddressed memory cell.

In some embodiments, floating the array digit line comprises applying an inhibit voltage to a gate of a thin film transistor (TFT) coupled between the array digit line and a bit line.

In some embodiments, the method further comprises grounding unselected word lines of the plurality of word lines capacitatively coupled to the array digit line.

In some embodiments, the method further comprises de-selecting a second unaddressed memory cell coupled to a second array digit line in the 3D memory array based at least in part on applying a pass voltage to a second thin film transistor (TFT) coupled between the second array digit line and a second bit line, grounding the second bit line, and grounding the second array digit line.

In some embodiments, the method further comprises de-selecting a second unaddressed memory cell by grounding an unselected word line in the plurality of word lines.

In some embodiments, the method further comprises, during de-selecting the unaddressed memory cell, selecting an addressed memory cell coupled to a selected array digit line, based at least in part on applying a word line access voltage to a selected word line in the plurality of word lines, applying a bit line access voltage to a selected bit line coupled to the selected array digit line, applying a passing voltage to a gate of a selected TFT coupled between the selected array digit line and the selected bit line to transfer the bit line access voltage to the selected array digit line.

For example, referring to the biasing conditions described with reference to FIGS. 8B, a memory cell may be programmed to a SET state (or it may be read according to a positive voltage reading scheme) by respectively applying to L0, L1, and L2 voltages GND, −3.5V (−2.5V for read) and GND, and respectively applying to R0, R1 and R2 voltages −3.5V, +1.0V and −3.5V. The addressed word line in the 3D array may be biased to the desired word line access voltage (e.g., +3.5V for SET or +2.5V for read), while unaddressed WLs may be grounded. This configuration will result in biasing array digit line P5, coupled to the addressed memory cell, to the desired digit line access voltage (−3.5V for SET or −2.5V for read) and therefore obtain the overall desired voltage drop across the addressed memory cell. Memory cells coupled to different array digit lines (e.g., pillars P1, P2, P3, P4, P6, P7, P8 and P9) are not disturbed because the respective digit lines are floated and their potential may be determined by word lines voltages weighted according to a capacitive ratio and may differ from ground voltage by a sufficiently small amount since all WLs are grounded except the addressed WL that is biased at the access voltage.

In a similar fashion, referring to the biasing conditions described with reference to FIGS. 8C (program to a RESET state) and 8D (read according to a negative read scheme), a memory cell may be accessed by respectively applying to L0, L1, and L2 voltages GND, +3.5V (+2.5V for read) and GND, and respectively applying to R0, R1 and R2 voltages +3.5V, +4.5V and +3.5V. The addressed word line in the 3D array may be biased to the desired word line access voltage (e.g., −3.5V for SET or −2.5V for read), while unaddressed WLs may be grounded. This configuration will result in biasing array digit line P5, coupled to the addressed memory cell, to the desired digit line access voltage (+3.5V for SET or +2.5V for read) and therefore obtain the overall desired voltage drop across the addressed memory cell. Memory cells coupled to different array digit lines are not disturbed because the respective digit lines are either grounded (e.g., pillars P1, P2, P3, P7, P8 and P9) or floated (e.g., pillars P6, P7).

In some embodiments, the unaddressed memory cell may be coupled to an array digit line (e.g., a vertical pillar in the 3D memory array) different from the array digit line coupled to the addressed memory cell. The unaddressed memory cell may share a same word line with the addressed memory cell. By floating the digit line coupled to the unaddressed memory cell, a safe condition is established while accessing (e.g., reading or programming, such as setting or resetting) the addressed memory cell to avoid or at least minimize disturbs on or from the unaddressed memory cells. The actual voltage of a floated digit line may depend on voltages of word lines that are capacitatively coupled to the floated digit line. Each word line may influence by capacitive coupling the voltage of the floated digit line and, since all unaddressed word lines may be grounded while only the addressed word line may be biased to a read/program access voltage, the actual voltage of the floated digit line remains close to ground. In some configurations, some of the digit lines coupled to unaddressed cells may be grounded, therefore also providing a safe and disturb-free condition. Further, memory cell coupled to unaddressed word lines (e.g., a word line in a different deck or plane), including memory cells sharing the same digit line as the addressed memory cell, may be kept in a safe and disturb-free condition by grounding the unaddressed word line coupled thereto. The steps of the method(s) described above may be carried out in a different order than described. Additional steps that have not been described may be carried out.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A memory device comprising:

a memory array of memory cells structured as a vertical 3D memory including a plurality of word lines configured orthogonally to a plurality of digit lines, wherein each of the plurality of digit lines crosses at least a couple of the plurality of word lines;

a plurality of conductive pillars, wherein each conductive pillar of the plurality of conductive pillars comprises a respective first sub-pillar and a respective second sub-pillar separated from each other by an insulative material extending vertically along the conductive pillar, and wherein each respective first sub-pillar and each respective second sub-pillar comprises a corresponding digit line of the plurality of digit lines; and a selection transistor at one end of a corresponding digit line of the plurality of digit lines, wherein the selection transistor is a thin film transistor (TFT) for selecting the corresponding digit line and accessing at least a memory cell associated with the corresponding digit line.

2. The memory device of claim 1, wherein a matrix of TFTs is provided under or above the plurality of digit lines with one transistor for each of the plurality of digit lines.

3. The memory device of claim 2, wherein a peripheral circuitry is formed under the matrix with sense amplifiers and decoding circuitry for word lines and bit lines.

4. The memory device of claim 2, wherein the TFTs are formed in a polysilicon layer.

5. The memory device of claim 1, further comprising a peripheral circuit layer having sense amplifiers and decoding circuitry realized in a silicon substrate.

6. The memory device of claim 1, wherein:

the TFT is an n-metal-oxide-semiconductor (NMOS) transistor with a drain region coupled to the corresponding digit line.

7. The memory device of claim 1, wherein the TFT comprises two gate regions in parallel with a gate oxide at one side of a channel region and another gate oxide at another side of the channel region.

8. The memory device of claim 1, comprising a stack of a plurality of building blocks, each building block comprising:

a respective memory layer with a respective plurality of word lines configured orthogonally to a respective plurality of digit lines, each digit line in the respective plurality of digit lines crossing at least a couple of word lines in the respective plurality of word lines, and a respective pillar selection layer with a respective plurality of thin film transistors (TFT), each TFT for selecting a corresponding digit line in the respective plurality of digit lines.

9. The memory device of claim 1, wherein each respective first sub-pillar and each respective second sub-pillar is coupled to a respective TFT configured to select a corresponding sub-pillar and access one or more memory cells associated with the corresponding sub-pillar.

10. The memory device of claim 1, further comprising:

a plurality of first conductive contacts in a substrate, wherein each of the respective first sub-pillars is coupled to a corresponding first conductive contact of the plurality of first conductive contacts; and a plurality of second conductive contacts in the substrate, wherein each of the respective second sub-pillars is coupled to a corresponding second conductive contact of the plurality of second conductive contacts.

11. The memory device of claim 1, wherein the insulative material electrically isolates memory cells associated with a first sidewall of a trench from memory cells associated with a second sidewall of the trench.

12. A memory device comprising:

a memory array structured as vertical 3D memory, the memory array comprising:

a plurality of memory cells;

a plurality of conductive pillars, wherein each conductive pillar of the plurality of conductive pillars comprises a respective first sub-pillar and a respective second sub-pillar separated from each other by an insulative material extending vertically along the conductive pillar, and wherein each respective first sub-pillar and each respective second sub-pillar comprises a corresponding digit line of a plurality of digit lines;

a plurality of word lines orthogonal to the plurality of digit lines, each of the plurality of digit lines crossing one or more of the plurality of word lines; and a plurality of selection transistors each coupled with a respective digit line of the plurality of digit lines, each selection transistor being a thin film transistor (TFT) configured to select the respective digit line and access one or more memory cells associated with the respective digit line.

13. The memory device of claim 12, wherein the plurality of selection transistors comprises a matrix of TFTs positioned above or below the plurality of digit lines, wherein each of the matrix of TFTs is associated with a corresponding digit line of the plurality of digit lines.

14. The memory device of claim 13, further comprising:

peripheral circuitry formed under the matrix of TFTs, the peripheral circuitry comprising one or more sense amplifiers and decoding circuitry associated with the plurality of word lines and the plurality of digit lines.

15. The memory device of claim 13, wherein the matrix of TFTs is formed in a polysilicon layer.

16. The memory device of claim 12, further comprising:

a peripheral circuit layer comprising one or more sense amplifiers and decoding circuitry positioned in a silicon substrate.

17. The memory device of claim 12, wherein one or more TFTs associated with the plurality of selection transistors each comprises:

an n-metal-oxide-semiconductor (NMOS) transistor with a drain region coupled to the respective digit line associated with the TFT.

18. The memory device of claim 12, wherein one or more TFTs associated with the plurality of selection transistors each comprises:

two gate regions in parallel with a first gate oxide at a first side of a channel region and a second gate oxide at a second side of the channel region.

19. The memory device of claim 12, comprising:

a stack of building blocks, each building block comprising:

a respective memory layer having a second plurality of word lines orthogonal to a second plurality of digit lines, each digit line of the second plurality of digit lines crossing one or more word lines of the second plurality of word lines, and a respective pillar selection layer having a respective plurality of TFTs, each of the respective plurality of TFTs configured to select a corresponding digit line of the second plurality of digit lines.

* * * * *